(12) United States Patent
Woolsey et al.

(10) Patent No.: US 12,218,644 B2
(45) Date of Patent: *Feb. 4, 2025

(54) ACOUSTIC RESONATOR

(71) Applicant: David Woolsey, Berkeley, CA (US)

(72) Inventors: David Woolsey, Berkeley, CA (US); Gabriel A. Matus, Morgan Hill, CA (US)

( * ) Notice: Subject to any disclaimer, the term of this patent is extended or adjusted under 35 U.S.C. 154(b) by 429 days.

This patent is subject to a terminal disclaimer.

(21) Appl. No.: 17/194,109

(22) Filed: Mar. 5, 2021

(65) Prior Publication Data

US 2021/0194450 A1   Jun. 24, 2021

Related U.S. Application Data

(63) Continuation of application No. 16/544,853, filed on Aug. 19, 2019, now Pat. No. 10,944,372.

(60) Provisional application No. 62/720,111, filed on Aug. 20, 2018, provisional application No. 62/720,107, filed on Aug. 20, 2018.

(51) Int. Cl.
  *H03H 9/25* (2006.01)
  *H03H 3/04* (2006.01)
  *H03H 9/17* (2006.01)

(52) U.S. Cl.
  CPC ............ *H03H 3/04* (2013.01); *H03H 9/172* (2013.01); *H03H 9/25* (2013.01)

(58) Field of Classification Search
  CPC .................................. H03H 9/172; H03H 9/25
  See application file for complete search history.

(56) References Cited

U.S. PATENT DOCUMENTS

| | | | |
|---|---|---|---|
| 3,931,388 A | 1/1976 | Hafner et al. | |
| 4,317,059 A | 2/1982 | Besson | |
| 4,720,651 A | 1/1988 | Nakazawa et al. | |
| 5,666,706 A * | 9/1997 | Tomita | H03H 3/02 29/25.35 |
| 7,369,013 B2 | 5/2008 | Fazzio et al. | |
| 7,671,427 B2 | 3/2010 | Kim et al. | |
| 8,531,083 B2 | 9/2013 | Sinha et al. | |
| 10,944,372 B2 * | 3/2021 | Woolsey | H03H 3/04 |
| 2002/0190814 A1 | 12/2002 | Yamada et al. | |
| 2005/0057324 A1 | 3/2005 | Onishi et al. | |
| 2005/0200433 A1 | 9/2005 | Aigner et al. | |
| 2006/0001508 A1* | 1/2006 | Ohara | H03H 9/02133 333/191 |
| 2007/0252476 A1 | 11/2007 | Iwaki et al. | |

(Continued)

FOREIGN PATENT DOCUMENTS

| | | |
|---|---|---|
| CN | 101064499 A | 10/2007 |
| CN | 101645699 A | 2/2010 |

(Continued)

OTHER PUBLICATIONS

European Search Report and Search Opinion, EP App. No. 19852637.8, Apr. 28, 2022, 12 pages.

(Continued)

*Primary Examiner* — Samuel S Outten
(74) *Attorney, Agent, or Firm* — Nicholson De Vos Webster & Elliott LLP; Judith Szepesi

(57) ABSTRACT

A resonator comprising a piezoelectric film which creates an acoustic path that is slightly longer in a central region of the resonator than at an edge of the resonator.

21 Claims, 24 Drawing Sheets

(56) References Cited

U.S. PATENT DOCUMENTS

| | | |
|---|---|---|
| 2010/0033063 A1 | 2/2010 | Nishihara et al. |
| 2010/0060384 A1 | 3/2010 | Taniguchi et al. |
| 2012/0299664 A1* | 11/2012 | Hara ................. H03H 9/02157 |
| | | 333/133 |
| 2013/0106534 A1* | 5/2013 | Burak ................... H03H 9/173 |
| | | 333/187 |
| 2014/0246305 A1* | 9/2014 | Larson, III ............ H03H 9/584 |
| | | 204/192.18 |
| 2016/0352308 A1 | 12/2016 | Ivira et al. |
| 2017/0111027 A1* | 4/2017 | Ii .............................. H03H 9/13 |
| 2017/0288636 A1 | 10/2017 | Feng et al. |
| 2018/0013401 A1 | 1/2018 | Lee et al. |
| 2018/0062609 A1 | 3/2018 | Yagami et al. |
| 2018/0123541 A1 | 5/2018 | Vetury et al. |

FOREIGN PATENT DOCUMENTS

| | | |
|---|---|---|
| CN | 101674062 A | 3/2010 |
| JP | 5136635 B2 | 2/2013 |

OTHER PUBLICATIONS

Non Final Office Action, U.S. Appl. No. 16/544,853, Sep. 1, 2020, 16 pages.
Notice of Allowance, U.S. Appl. No. 16/544,853, Jan. 15, 2021, 7 pages.
PCT Search Report PCT/US2019/047115, dated Apr. 11, 2019, 3 pages.
PCT Written opinion PCT/US2019/047115, dated Apr. 11, 20019, 5 pages.
First Office Action, CN App. No. 201980061400.4, May 31, 2024, 17 pages (07 pages of English Translation and 10 pages of Original Document).

* cited by examiner

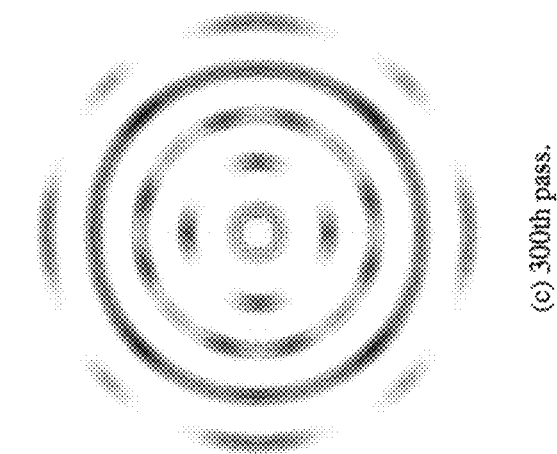
FIG. 7D (c) 300th pass.
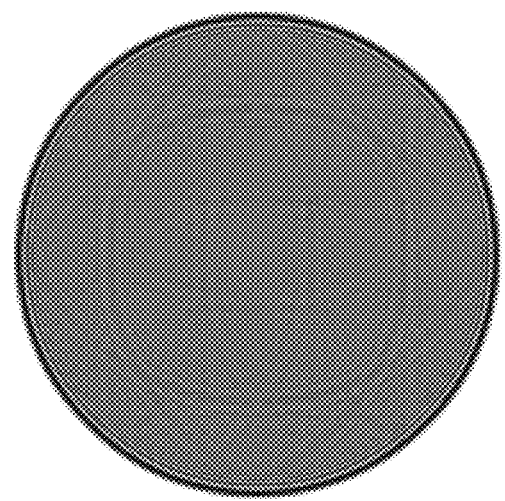
FIG. 7C (b) 1st pass.
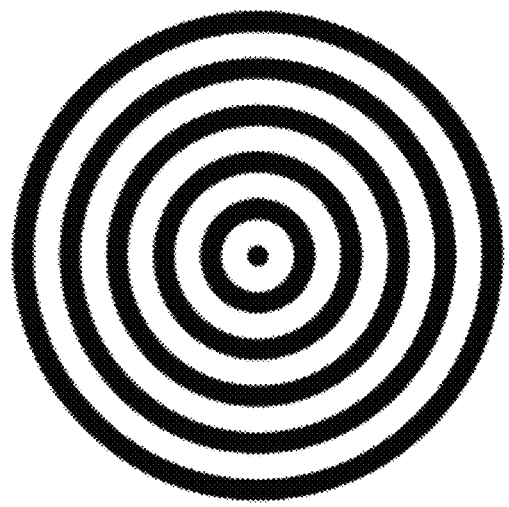
FIG. 7B (a) Axicon mask

ACOUSTIC RESONATOR

RELATED APPLICATIONS

The present application U.S. patent application is a continuation of Ser. No. 16/544,853, filed on Aug. 19, 2019, issuing as U.S. Pat. No. 10,944,372 on Mar. 9, 2021, which claims priority to U.S. Provisional Application No. 62/720,107, filed on Aug. 20, 2018, and U.S. Provisional Application No. 62/720,111, filed on Aug. 20, 2018, and incorporates all prior applications by reference in their entirety.

FIELD

The present invention relates to resonators, and more particularly to altering the shape or form of the resonator film.

BACKGROUND

Thin-film bulk acoustic resonators (FBAR or TFBAR) consist of a piezoelectric material sandwiched between two electrodes and acoustically isolated from the surrounding medium. FBAR devices using piezoelectric films generally resonate in the frequency range of 100 MHz to 10 GHz. Aluminum nitride (AlN) and zinc oxide (ZnO), with thicknesses ranging from several micrometers down to tenths of micrometers, are two common piezoelectric materials used in FBARs.

BROADCOM™ (formerly Avago Technologies) is one of the leading manufacturers of FBAR devices. The main application of Avago FBARs is in 4G cell phones and they are in extremely high demand. Avago FBARs are in APPLE® and SAMSUNG® flagship products and there is not enough manufacturing capacity to satisfy the whole market demand. Avago is focused almost entirely on producing FBARs for cell phones—to the exclusion of other, orthogonal markets. Domestic manufacturing capability limits the availability of Avago FBAR.

Thus, there is a long-felt need for an improved FBAR.

BRIEF DESCRIPTION OF THE FIGURES

The present invention is illustrated by way of example, and not by way of limitation, in the figures of the accompanying drawings and in which like reference numerals refer to similar elements and in which:

FIG. 7B is one embodiment of the cyclic axicon pattern.

FIGS. 7C and 7D illustrate the impulse simulation of the cyclic axicon resonator.

DETAILED DESCRIPTION

Figure 1A:
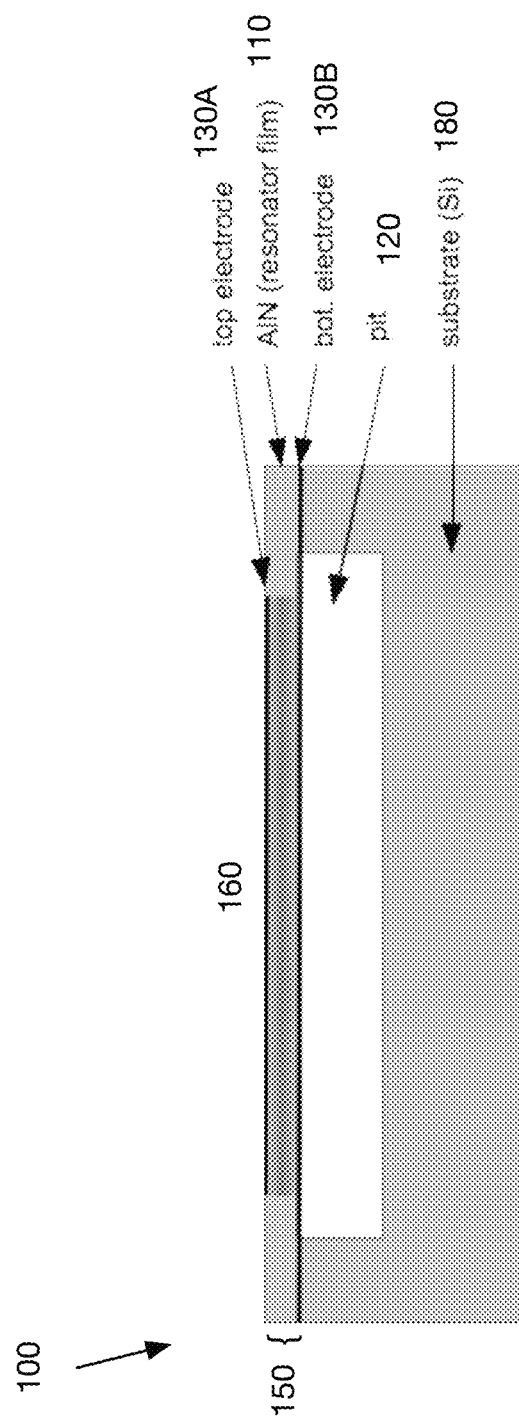
FIG. 1A illustrates one embodiment of a side view of a simplified film bulk acoustic resonator (FBAR) structure.

The present invention discloses methods to improve acoustic resonator design, by altering the shape or form of the resonator film which is utilized. The improvement in one embodiment may be based on doping the resonator film, in one embodiment. The improvement in another embodiment may be based on depositing additional material on the resonator film to create a convex or concave structure, in one embodiment. The improvement in another embodiment may be based on etching or depositing a pattern in the resonator film stack. In one embodiment, the deposited pattern or etching creates a structure similar to the diffractive embodiment of an optical axicon lens.

The following detailed description makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Glossary

FBAR: Film bulk acoustic resonator, consisting of a piezoelectric material sandwiched between two electrodes and acoustically isolated from the surrounding medium. FBARs include resonators isolated by suspension over a void and resonators isolated by being positioned over a reflector (SMR). FBAR devices using piezoelectric films generally resonate in the frequency range of 100 MHz to 10 GHz.

Q factor: Quality factor is a dimensionless parameter that describes how under-damped an oscillator or resonator is, as well as characterizes a resonator's bandwidth relative to its center frequency. Higher Q indicates a lower rate of energy loss relative to the stored energy of the resonator; the oscillations die out more slowly. A pendulum suspended from a high-quality bearing, oscillating in air, has a high Q, while a pendulum immersed in oil has a low one. Resonators with high quality factor have low damping so they ring longer. The bandwidth of a resonator can be defined in terms of its Q as: $\Delta f = f_0/Q$.

Acoustic resonator: An acoustic resonator, or bulk acoustic resonator, is a device consisting of piezoelectric material sandwiched between two electrodes that is acoustically isolated from the surrounding medium. FBARs are employed as radio frequency (RF) filters in cell phones and other wireless applications. Such filters made from a network of resonators and are designed to allow only specific frequency ranges to be received or transmitted.

Fourier Transform: The Fourier transform decomposes a signal that is a function of time into the frequencies that make it up. The equation defining a Fourier Transform is for any real number $\vartheta$:

$$F(\vartheta) = \int_{-\infty}^{\infty} f(x) e^{-2\pi i x \vartheta} dx$$

where the independent variable x represents time, and the transform variable $\vartheta$ represents frequency.

Figure 3A:
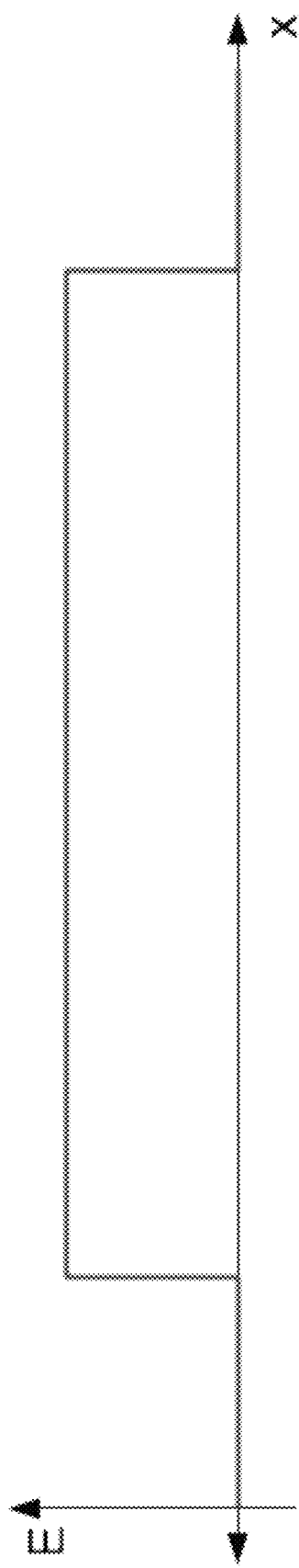
FIG. 3A illustrates a simple model of a top hat electric field.
Figure 3B:
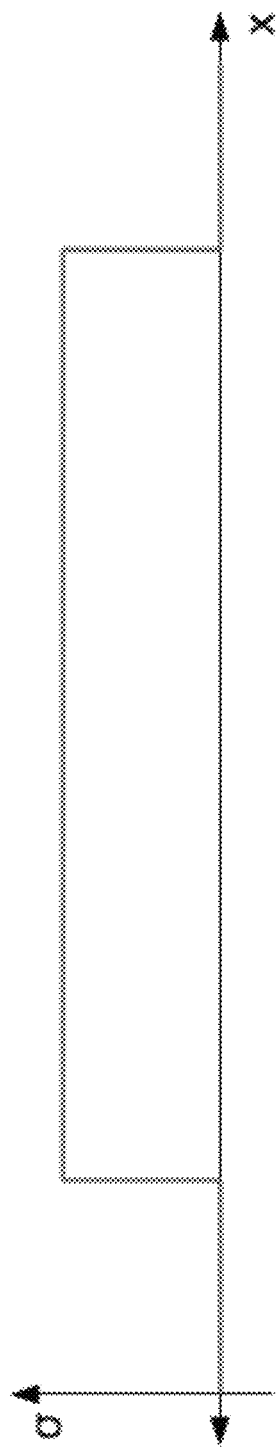
FIG. 3B illustrates a stress diagram, for the simple model of the top hat electric field of FIG. 3A.
Figure 3C:
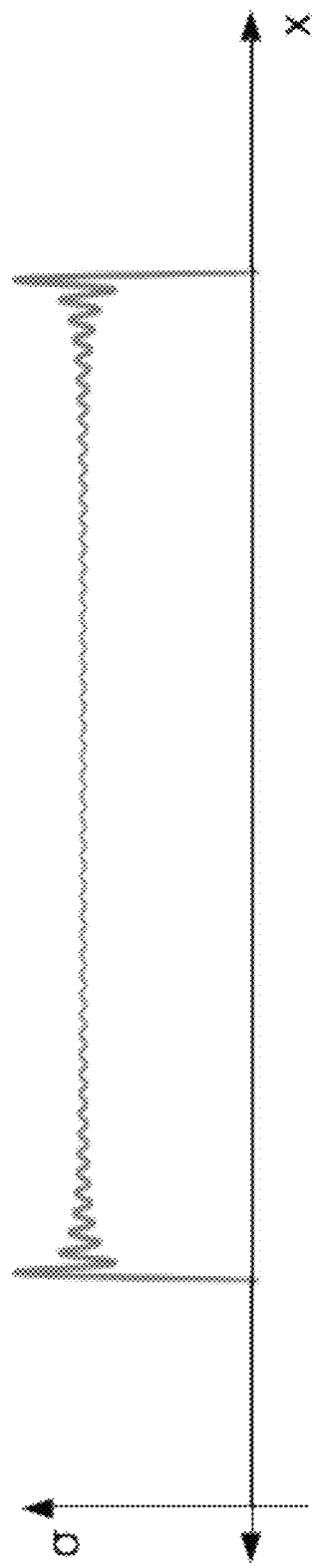
FIG. 3C shows a more accurate model of the stress, based on Fourier components ranging from the low wavenumber cutoff to the high wavenumber cutoff (resonator impulse response).
Figure 3D:
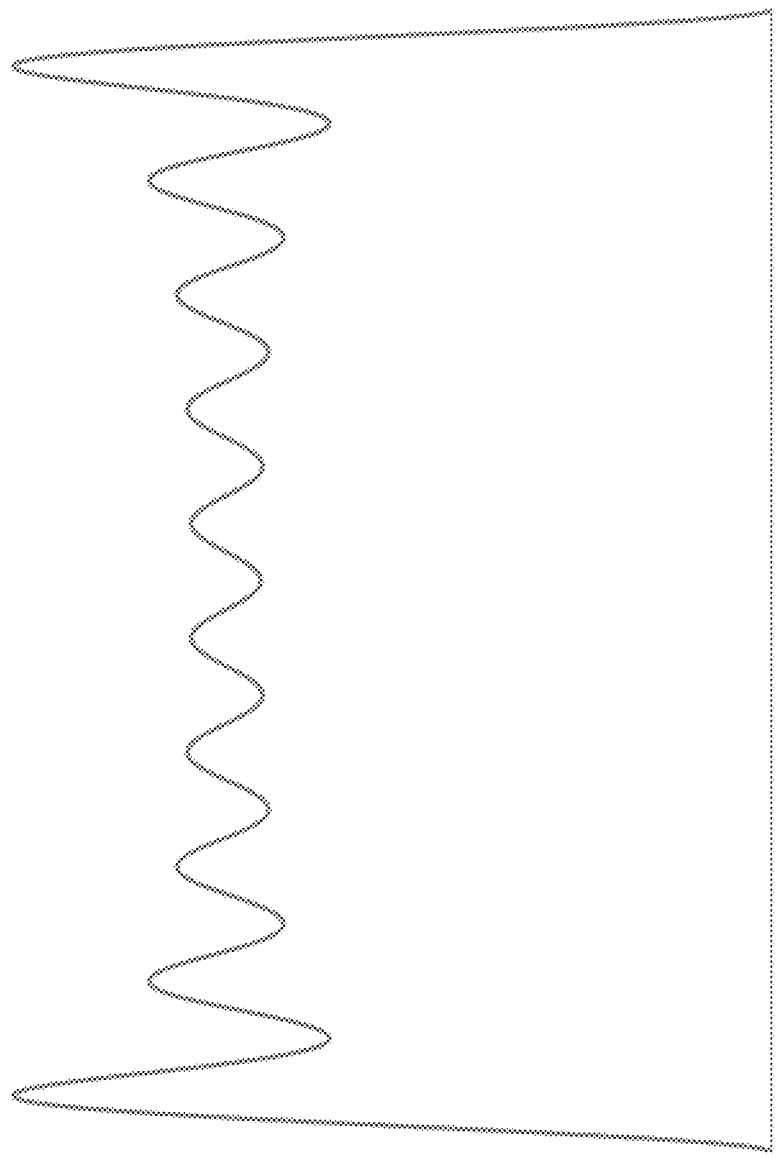
FIG. 3D illustrates a simple squared sum of the 10 lowest harmonics used to construct the top hat function.

Top Hat Function: A "top hat" function, over an interval from $-L$ to $+L$, can be constructed (neglecting normalization) by summing an infinite series of the form:

$$y = \sum_{n=1}^{\infty} \frac{(-1)^{n-1}}{(2n-1)} \cos\left((2n-1)\pi \frac{x}{2L}\right)$$

Where L is the length of the "top hat" function and n is the nth harmonic of the series. Note that the "top hat" centered about $x=0$ is only composed of odd harmonics because it is a symmetric function (hence the $(2n-1)$ representation that transforms the index, n, to only odd numbers from +1 to infinity). An approximate top hat function can be constructed by summing a subset of the harmonics. FIG. 3C illustrates a simple squared sum of the 10 lowest harmonics used to construct a top hat function. FIG. 3D illustrates the individual harmonics themselves. Note that the "top hat" function as defined here is truncated to zero for values of x less than $-L$ and more than $+L$. In other words, it is the function above multiplied by 1 for $-L<=x<=+L$ and multiplied by 0 for $|x|>L$.

Acoustic lens: An acoustic lens is a structure that imparts a relative delay to some portion of an acoustic wave's wave front. In the case of a "converging", or "convex" lens the material in the lens' central region has a lower sound speed or is thicker than the surrounding lens material. Conversely, in the case of a "diverging", or "concave" lens the material in the lens' central region has a higher sound speed or is thinner than the surrounding lens material. This effect may be referred to as "acoustic lensing."

Overview

The FBAR is the enabling technology of 4G cell phones, as the SAW filter was the enabling technology of analog cell phones. In most cases, such resonators are suspended over a void but solidly mounted resonator (SMRs) may also be used. The purpose of FBARs in the data communications electronics of cell phones is to discriminate adjacent data channels (in frequency space). The more selectively the data channels can be discriminated, the more channels may be used in a given cell phone band. One limiting factor in how many data channels may be used is the quality-factor, or "Q", of the FBARs used as channel filters. The higher the Q, the narrower the channels that may be defined, and the more of them that may be fit into a given RF transmission or reception bandwidth. Presently, a typical cell phone has 10 to 20 FBAR devices. These FBARs are used to define the data channels.

There are several immediate benefits to narrowing the data channel spacing: better data performance for the user because more data channels can be utilized, and more FBAR sales by the manufacturer in proportion to the number of data channels. The Q improvement depends on resonator size. Therefore, a further benefit of improving the Q of a given resonator is that the resonator can be reduced in size while maintaining or even improving its Q value, compared to prior designs. This increases the number of devices that can be made on a single wafer, increases production, and reduces cost. Thus, improving FBAR device Q is advantageous.

The reason that an oscillator has a finite Q is (mostly) that in real, physical systems there are always energy loss mechanisms. The Q of an oscillator system can be defined through its rate of energy loss as:

$$Q = 2\pi * \frac{\text{Energy Stored}}{\text{Energy Lost (Per cycle)}} = \frac{\text{Energy Stored}}{\text{Energy Lost (Per radian)}}$$

FBAR devices are prone to energy loss due to various mechanisms. One of the most significant is mechanical coupling to their substrate. Other energy loss mechanisms include resistive losses in the electrodes and mechanical (acoustic) losses in the piezoelectric and other materials in the FBAR "stack". Reducing the effect of the worst of these loss mechanisms would improve the Q.

There are two main ways to reduce the energy losses into the substrate: by suspending the FBAR over a pit so that its bottom face is not in contact with anything, or by building the piezoelectric film over an acoustic reflector (SMR). For the purposes of this discussion, the term "FBAR" encompasses both types of resonators. In practice, the SMR seems to be inferior to the suspension method in its ability to isolate the resonator structure because it has losses into the acoustic reflector in addition to losses to its edges similar to suspended designs. Additionally, by shaping the piezoelectric film in such a way that acoustic energy does not get directed to the edges of the resonator, and from there into the substrate, energy loss can further be reduced.

The substrate losses in an FBAR suspended over a void are only at the places where the FBAR physically contacts the substrate, generally the FBAR's perimeter. Typically this leads to FBAR Q having roughly an area/perimeter relation (Larger devices tend to have higher Q). In the case of SMR devices the entire resonator film is in mechanical contact with the substrate via the reflector stack but the purpose of the reflector is to acoustically decouple the bottom face of the resonator from the substrate. However, even though the edges of an SMR may be mechanically detached from the substrate, an SMR may still have the unwanted behavior of excessive spurious modes caused by acoustic waves traveling tangent to its surface. Additionally, in the case of an SMR without edge coupling to the substrate the spurious modes can potentially be much larger than in a similar FBAR.

FIG. 1A illustrates one embodiment of a simplified FBAR 100 structure. In this embodiment, the piezoelectric film 110 is suspended over a void, or pit 120. The film 110 has conductive electrodes 130 on the top 130A and bottom surfaces 130B to provide electrical field coupling to the film 110 and to define the shape of the resonator's outline. The portion of the film 110 between both the bottom and top electrodes, is the region 160 under piezoelectric stress.

Figure 1B:
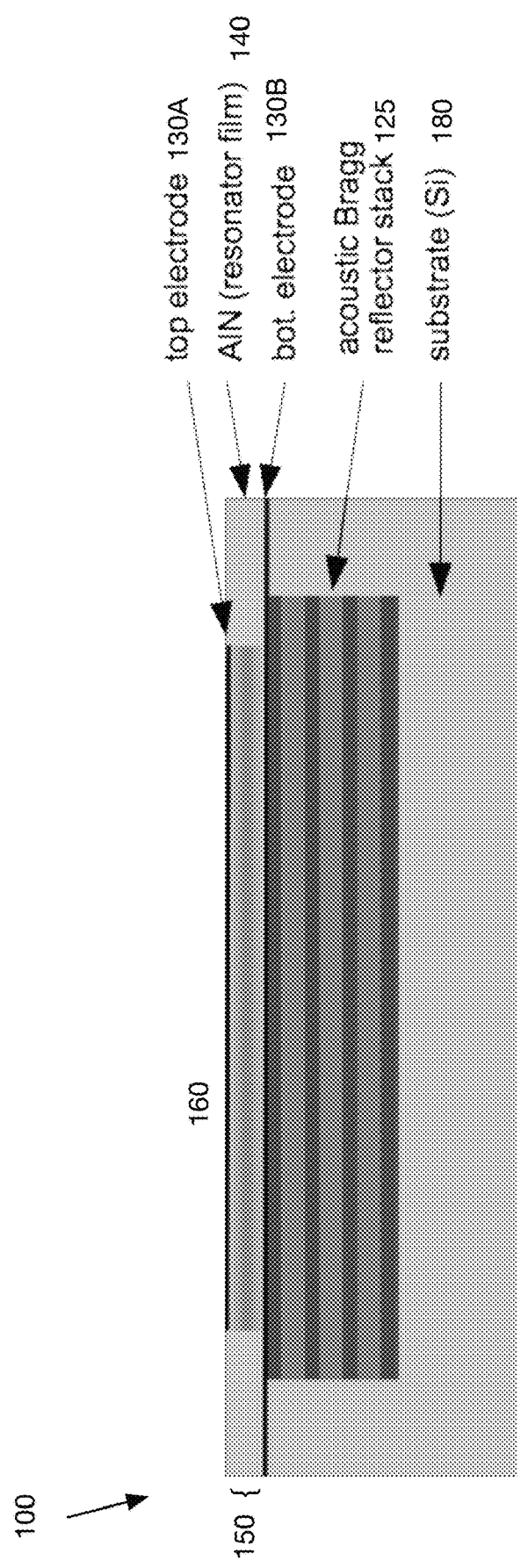
FIG. 1B illustrates one embodiment of a side view of a simplified solidly mounted resonator (SMR) structure.

FIG. 1B illustrates another embodiment of a simplified FBAR structure, in which the piezoelectric film is built over a reflector, rather than a pit or void. Such devices are referred to as solidly mounted resonator (SMR). An SMR, or solidly mounted resonator is similar to an FBAR except that it utilizes an acoustic reflector in place of an undercut isolation void. In one embodiment, the reflector is an acoustic Bragg reflector stack. Although the below illustrations use the FBAR structure with a void, the present improvements to FBAR structures may be utilized with either structure.

A simple version of an FBAR is constructed as a stack of planar layers of material. The resonator 150 itself is composed of the top electrode 130A, a layer of piezoelectric material 140 and a bottom electrode 130B. In one embodiment, the piezoelectric material 140 is aluminum nitride (AlN) or zinc oxide (ZnO).

The resonator 150 is built with a cavity 120 (or reflector 125, if an SMR) beneath it and it is attached to the silicon substrate 180 only at its edges. In one embodiment, the cavity 120 is made using a chemical etching process through one or more vias cut in the AlN layer. Since the resonator 150 is constructed over a cavity 120 only its edges can mechanically couple to the substrate 180. If care is taken to design the resonator materials to be low loss (mechanically very homogeneous and stiff, and the electrodes and interconnects very conductive) then the only significant losses will be at the resonator edges in contact with the substrate.

How much energy actually gets to the edges depends on how well waves can bounce back and forth across the surface of the FBAR 100, and that depends on the shape of the resonator. A square is bad choice for a design due to its high degree of symmetry and parallel sides. Waves can reflect back and forth across the surface of the square and build up to significant amplitude via constructive interference. In one embodiment, the FBAR structure utilizes an irregular pentagon or other asymmetric polygon with irrational length ratios. The length of each side varies, to reduce reflections.

Figure 2A:
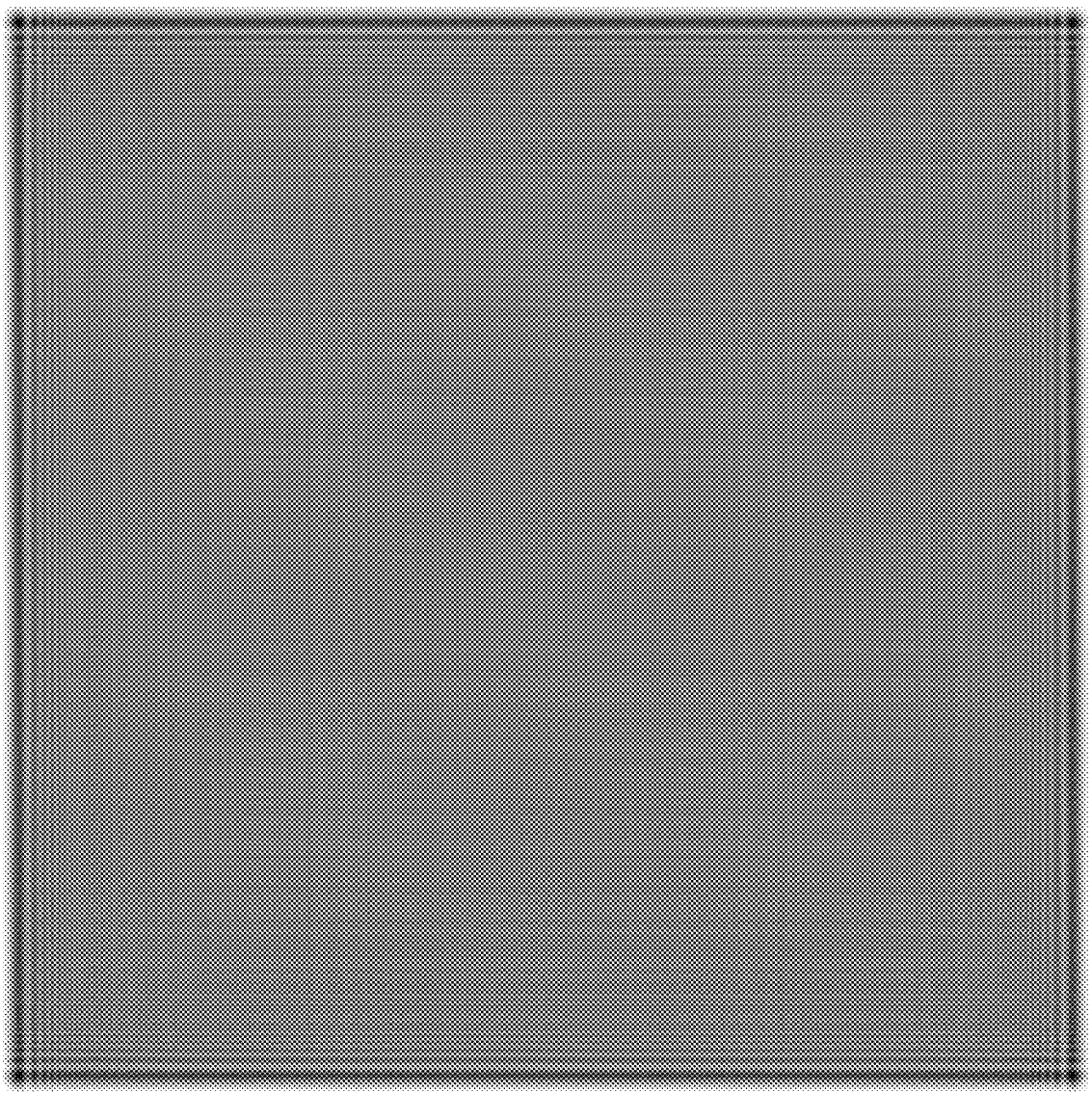
FIGS. 2A and 2B show an impulse simulation with a square FBAR resonator.
Figure 2B:
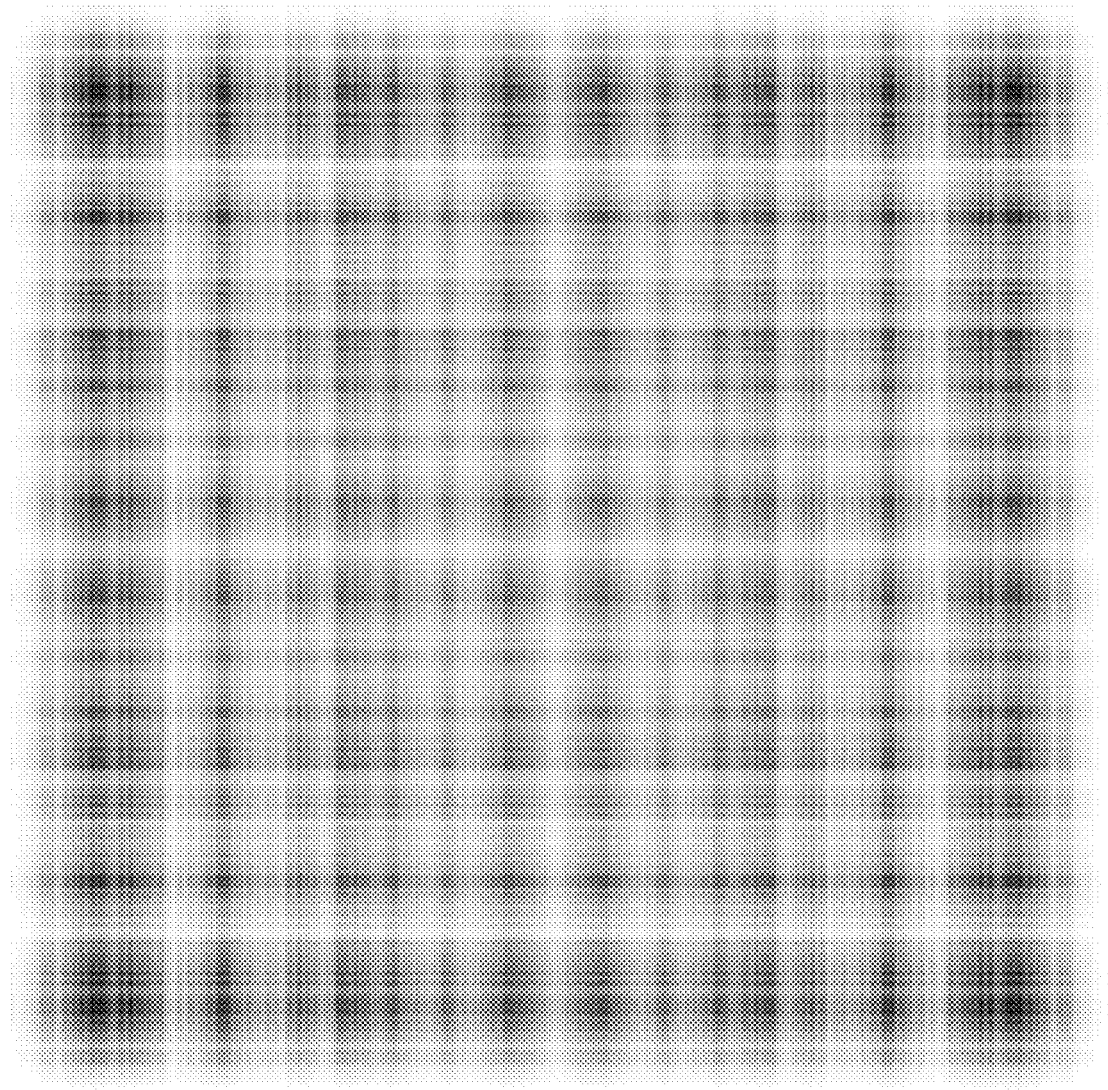

FIGS. 2A and 2B show an impulse simulation with a square FBAR resonator. The presence of the pronounced "banded" structure is evidence of constructive interference.

Figure 2C:
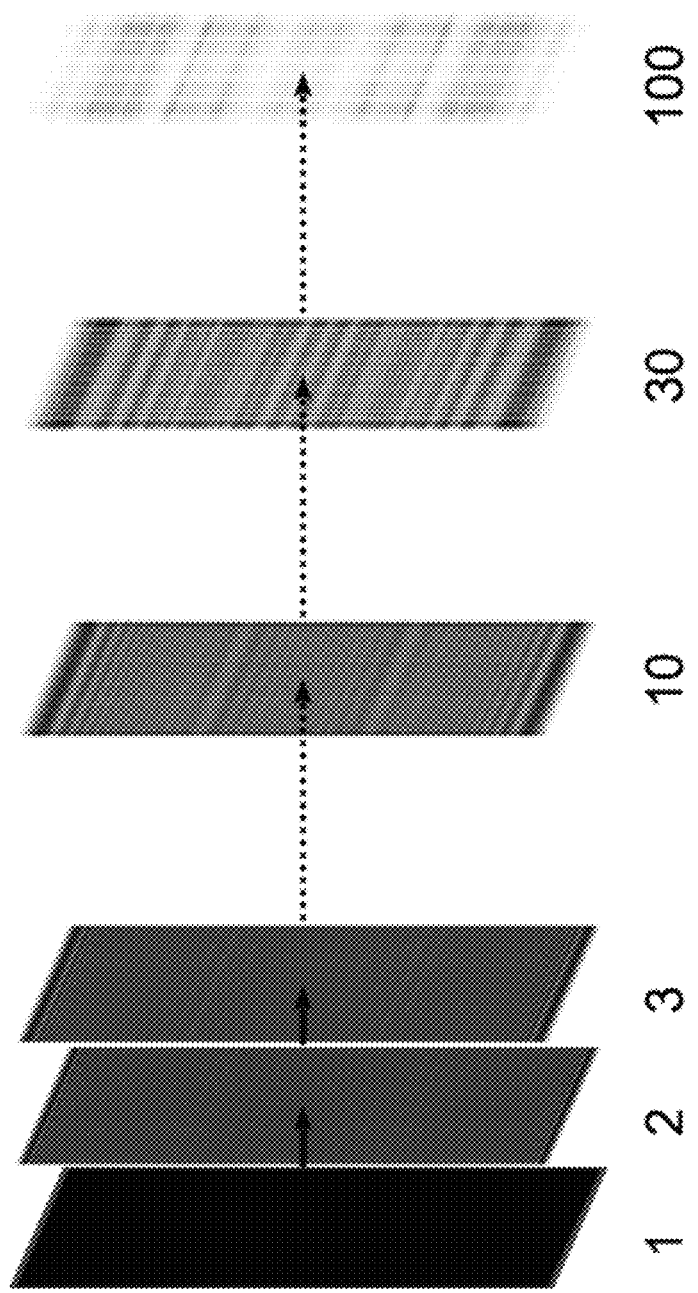
FIG. 2C illustrates the effects of wave diffraction by repeated aperture masks.

FIG. 2C illustrates the effects of wave diffraction by repeated aperture masks. This shows the evolution of transverse (spurious) mode structure. The example shown here is a series of repeated square apertures spaced at twice the (effective) acoustic film thickness. This example modeled an SMR structure, so the bottom surface of the resonator did not have an aperture mask but the top surface did (the top electrode outline). Wave energy diffracted to the edge of the aperture was assumed to be lost into the device substrate. The number shown is the nth aperture. The 1st frame contains the initial distribution of impulse energy and all following frames contain the repeated diffractions from the device's edges. Modeling the standing wave in the resonator as a traveling wave in a "stack" of identical resonators facilitate physical insights.

An analogy that may explain why this modeling is used, is a long hallway with door-less door frames set at repeating intervals such that a person traveling straight down the hallway would pass through every frame. There is a bit of position uncertainty, or fuzziness, in the location of the person traveling the hallway. The traveler's position uncertainty makes it impossible for the them to "cleanly" pass through the door frames without being slightly deflected by the frames. As the traveler progresses down the hallway they accumulate an uncertainty in their direction of travel because of their repeated, though (initially) weak, interaction with the frames. As their direction of travel becomes less and less straight along the hallway, their interactions with the door frames become more and more strong. Eventually the traveler's direction of travel becomes so scrambled that collisions with the frames dominate their motion. Obviously, minimizing the interactions with the door frames is important for the traveler to make it farther along the hallway.

In the "hallway analogy" the hallway and door frames are in a linear arrangement that is traversed only once by the traveler. It is equivalent to, though easier to understand, a similar analogy wherein the hallway is replaced by a single segment of hall, a "room", with door frames on each end containing "reflectors" that would cause a traveler progressing to a door frame to have the component of their motion along the hall reversed (like "ball bouncing off wall"). In this analogy, the traveler would "bounce back and forth" between the reflectors in the frames in the little "room". However, the traveler would still have the weak position uncertainty, as in the hallway analogy above, that would cause (initially) weak interactions with the door frames, and an accumulation of uncertainty in their direction of motion. Eventually the traveler's motion would become just as scrambled as in the hallway, although it would be more difficult to understand why because the presence of "reflectors", and the back-and-forth motion of the traveler within the room in the description provide distractions to the imagination.

One approach is to model the standing wave in the resonator as a traveling wave in a repeating "stack" of identical resonators, much like using the "hallway" description instead of the "room" description. The two are equivalent, though they facilitate differing sets of physical insights. FIG. 2C's simulation utilizes this analogy.

Another method of reducing the energy that gets lost at the resonator edges is to suppress the harmonics that are introduced as a consequence of driving the entire resonator surface. In standard resonators, the driving force across the film of the resonator is a constant from one area to the next (constant stress) because the electric field between two parallel plane electrodes is a constant (except at the edges).

The stress induced in an FBAR's film is a function of the electric field applied and the material's piezoelectric response to the field. In the case of FBAR devices the RF electric field tends to be spatially a constant throughout the bulk of the material between the top and bottom electrodes. One way of representing the mode structure of waves induced by the electric field is a Fourier analysis of the driving field. In the case of a typical applied RF electric field that is a constant everywhere between the top and bottom electrodes, and zero everywhere else, we can use the Top Hat function and study the resulting Fourier wave components. The top hat function is zero outside a specified range, and of constant, finite value within the specified range Typically the function is normalized so that the product of its length and amplitude is unity.

In the FBAR 100 shown in FIG. 1A, the electric field (and resulting material stress) is constant in the bulk of the material between the electrodes and falls promptly to zero outside the region of the electrodes. This can be represented as shown in FIG. 3A, showing the simple model of a top hat electric field. Since the response of the piezoelectric film is modeled as linear and proportional to the applied electric field, the stress induced in the material should be a constant between the electrodes and fall to zero outside the electrodes, as shown in FIG. 3B.

The Fourier components in the (impulse) response generally should not include wave components that have higher frequencies than the resonance being driven in the bulk material. Unless the film is being driven into higher order modes of excitation than the fundamental, such as by non-linear effects, the shortest wavelength (the high wavenumber cutoff) that the Fourier synthesis ought to contain is, roughly, twice the acoustic thickness of the FBAR. The longest wavelength (the low wavenumber cutoff) that the Fourier synthesis can contain is twice the acoustic length (or width) of the FBAR device. Thus, a finite range of waves add up and represent the material's response to the driving electric field. This analysis ignores non-linear effects.

FIG. 3C shows a more accurate model of the stress, based on Fourier components ranging from the low wavenumber cutoff to the high wavenumber cutoff. The response is calculated by summing the Fourier components of a top hat function in the range between the low and high wavenumber cutoffs and then squaring the resulting synthesized function. The rapid fluctuations in amplitude near resonator edges become apparent in this model.

The energy transfer to the FBAR device edges is dependent on the quantity, spatial frequency, and amplitude of the harmonics. Reducing the presence of those harmonics will prevent them from constructively interfering and building up to transport significant energy. There can be significant spatial modulation to the response of a spatially constant, but time varying, (electric field) stimulus due to the presence of a finite upper bound to the frequency of the Fourier components available to construct the actual response.

Figure 3E:
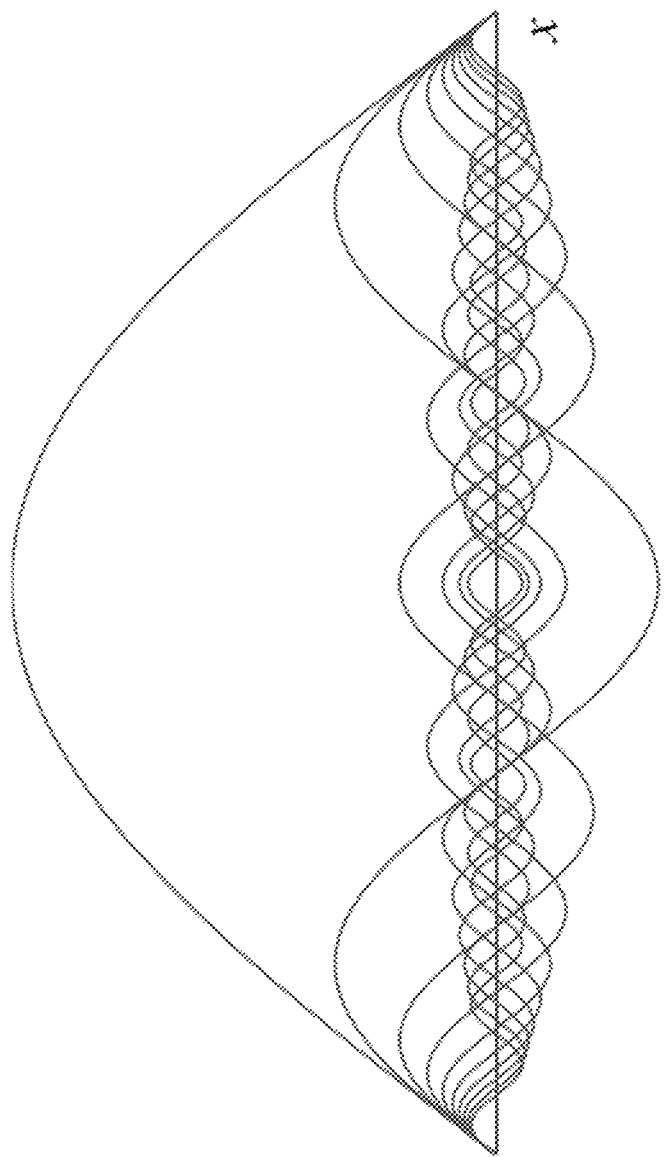
FIG. 3E illustrates the individual harmonics.
Figure 3G:
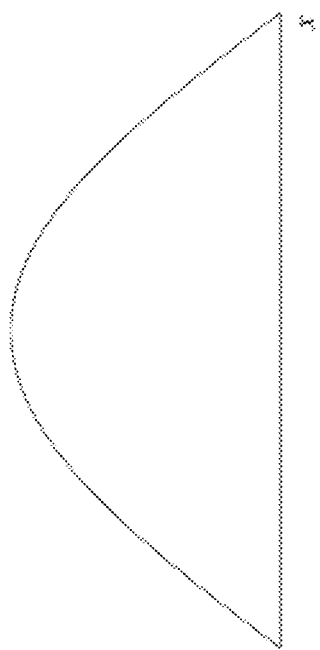
FIG. 3G illustrates only the fundamental component of the top hat function.
Figure 3F:
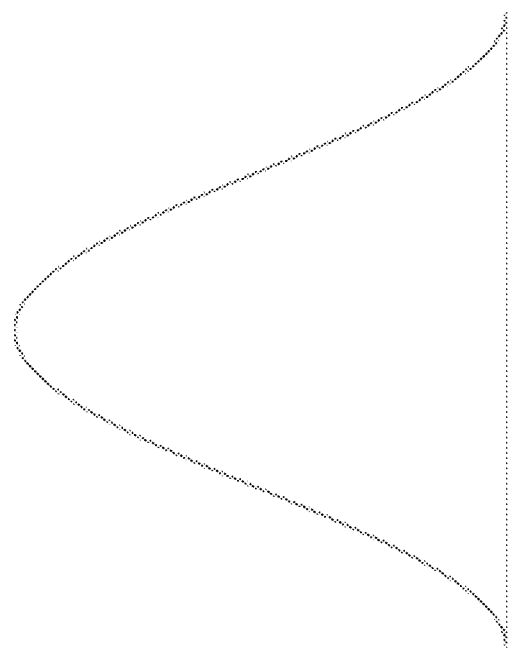
FIG. 3F illustrates a squared fundamental showing the variation of response intensity.

Having only the few lowest harmonic components available to construct an approximate top hat function leads to the seemingly undesirable result of having large spatial fluctuations in the response function. However, the energy transport depends on the product of the synthesized function's intensity variation and how rapidly the variations occur. Thus, even large variations away from an ideal top hat function in the intensity of the resulting waveform do not necessarily indicate large energy transport. The energy transport to the edges of the device may still be small if the waveform varies slowly in space. In the limit of approximating the top hat using only the first order harmonics, shown in FIG. 3F, the fundamental component of the top hat function shown in FIG. 3G, something interesting happens: The rate of variation of response intensity is held to a minimum, thus the energy transport to the edges of the response field (device edges) is minimized.

Therefore, having a planar resonator structure that has a constant top hat stress distribution across its surface is a poor way to make a low loss resonator. In one embodiment, variations of the design that can be used to create a spatial stress distribution in the resonator that is similar to figure the fundamental component of the top hat function include:

Ground State resonator
Focused Resonator
Focused Ground State Resonator
Cyclic Axicon Resonator Embodiments of the Improved FBAR Ground State Resonator This design takes advantage of the fact that the intensity of the electric field within the piezoelectric film is tapered if the electrode does not extend all the way to the edges of the film, and is aligned with the film's piezoelectric axis.

Figure 4A:
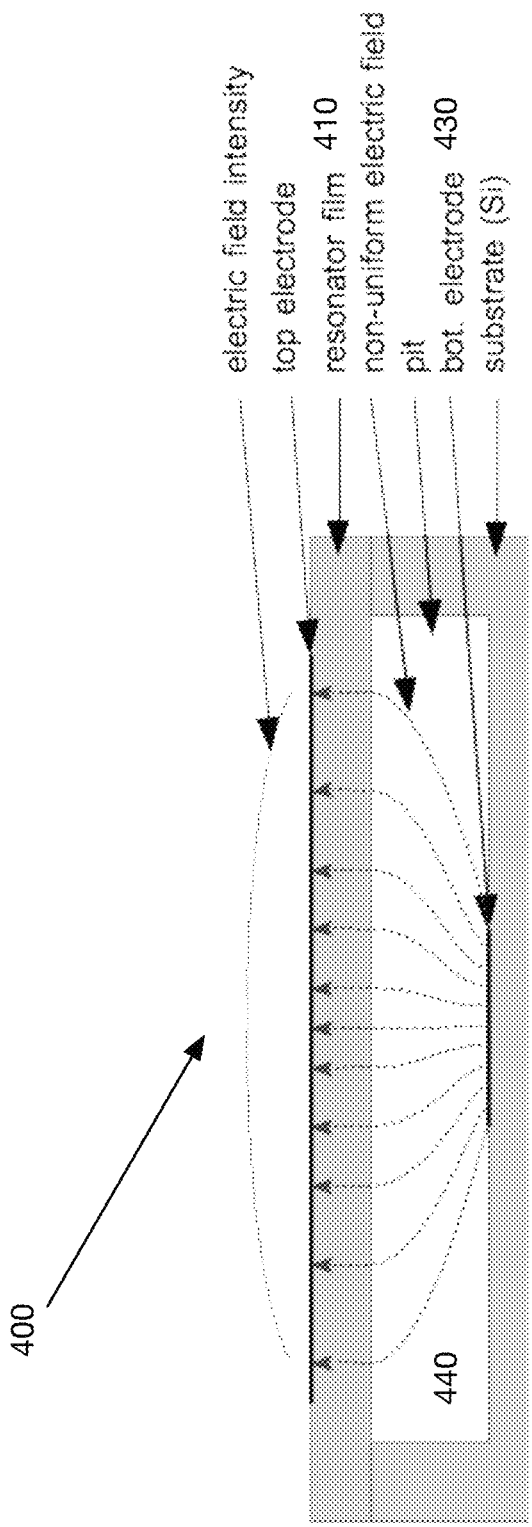
FIG. 4A illustrates one embodiment of a ground state resonator.

FIG. 4A illustrates one embodiment of a ground state resonator 400 in which the pit 440 beneath the piezoelectric film 410 is fairly deep, and the bottom electrode 430 is placed on the bottom of the pit 440. The bottom electrode spans only a portion of the resonator to create a tapered electric field towards the resonator's edges and a stronger field towards its center. This illustration shows the non-uniform electric field.

Figure 4B:
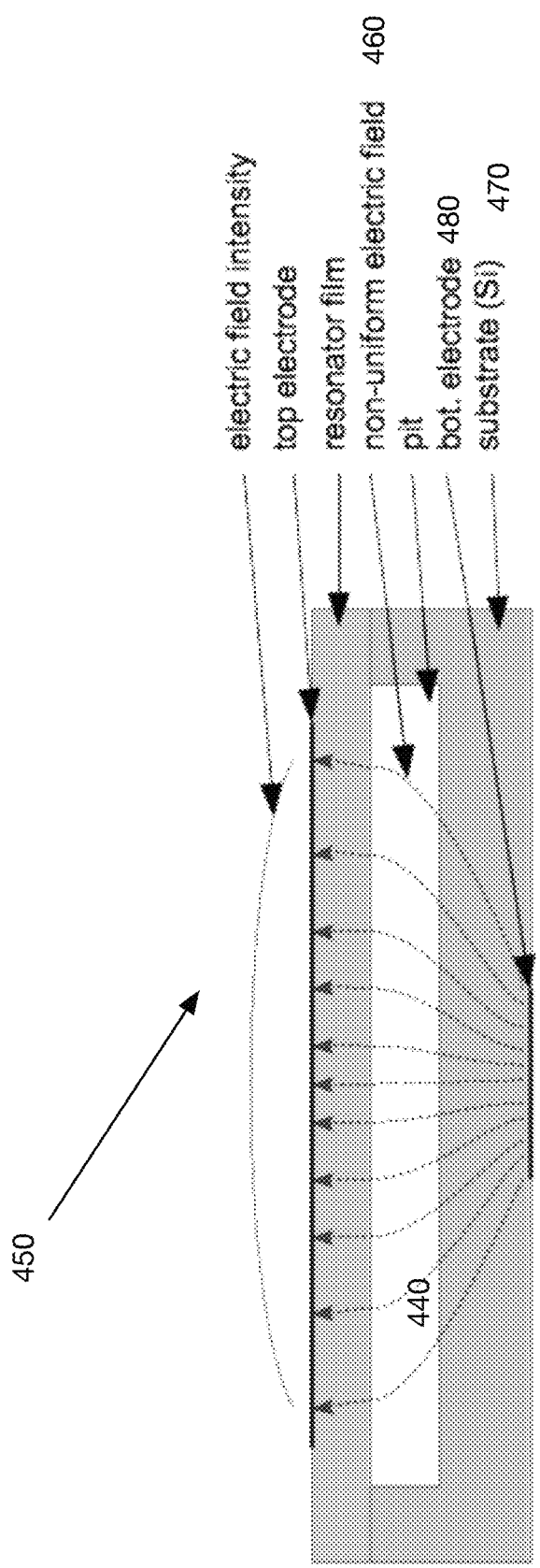
FIG. 4B illustrates another embodiment of a ground state resonator.

FIG. 4B illustrates an alternative embodiment of the ground state resonator FBAR 450 in which the bottom electrode 480 is on the bottom of the substrate 470, with an insulating and low loss substrate.

Figure 4C:
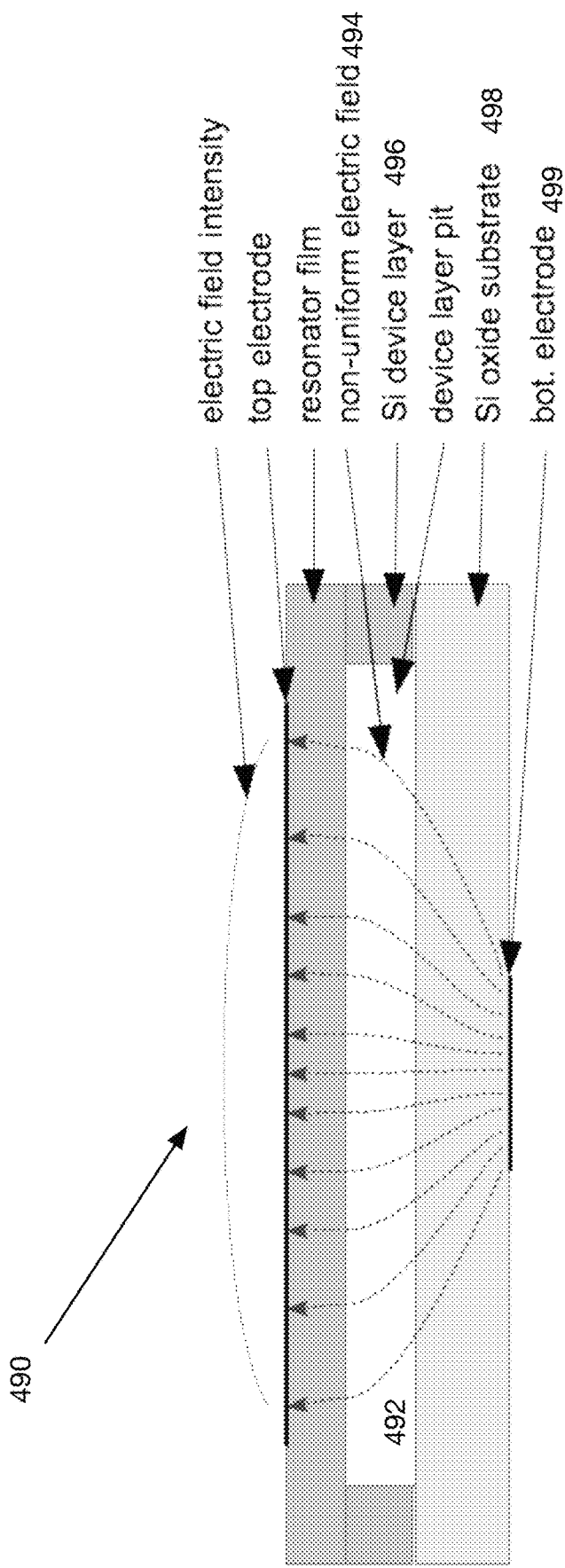
FIG. 4C illustrates another embodiment of a ground state resonator.

FIG. 4C illustrates one embodiment of the ground state resonator of FIG. 4B, utilizing an oxide wafer. An Si device layer 496 is used to support the resonator film. When the pit is etched, the etch, stops on the oxide substrate 498. The bottom electrode 499 is positioned on the back side of the oxide substrate 498.

In ground state resonators, the bottom electrode 480 is a smaller size than the film 410. This would cause a considerable fringing of the electric field toward the edges of the resonator. The effect of the fringing field would be to reduce the electromechanical response of the piezoelectric film near its edges. By tailoring the response of the film to more nearly match an (idealized) half-cosine shaped deflection, the higher frequency modes tangent to the resonator's surface would be reduced. This would reduce energy transport to the device's edges and improve Q factor.

However, there are drawbacks to any embodiment that moves the top or bottom electrodes farther away from the piezoelectric material. The most important drawback being that the intensity of the electric field driving the piezoelectric material is inversely proportional to the distance between the electrodes.

Focused Resonator

The acoustic wave may be focused by shaping the resonator, to create a tapered convex area in at least a portion of the resonator. The shaping is to modify the acoustic thickness of the resonator so that it forms more of a convex (or concave) lens than a flat, parallel plate structure.

Figure 5A:
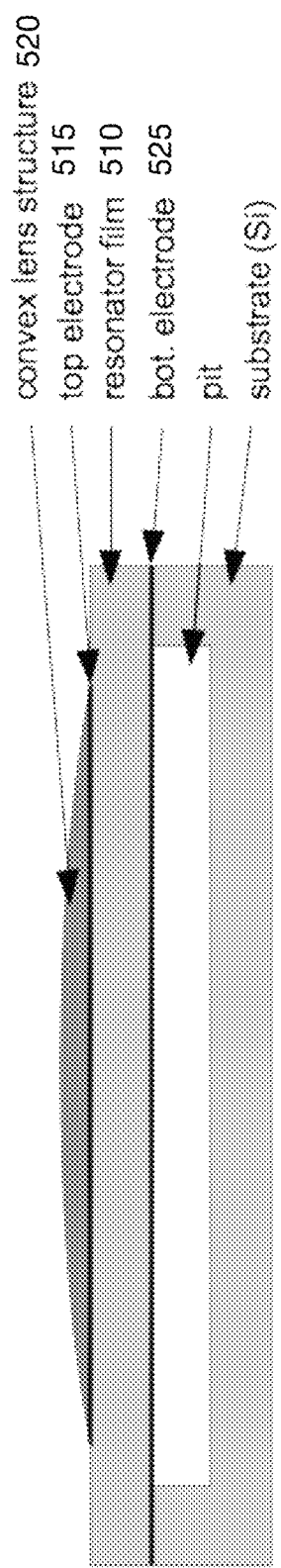
FIG. 5A illustrates a lens embodiment of the focused resonator.

FIG. 5A illustrates one embodiment of the focused resonator. A convex structure 520 is formed on top of the resonator 510. In one embodiment, the convex structure 520 is positioned over the top electrode. The top electrode 515 may be located on top of the convex structure 520, in one embodiment.

Figure 5B:
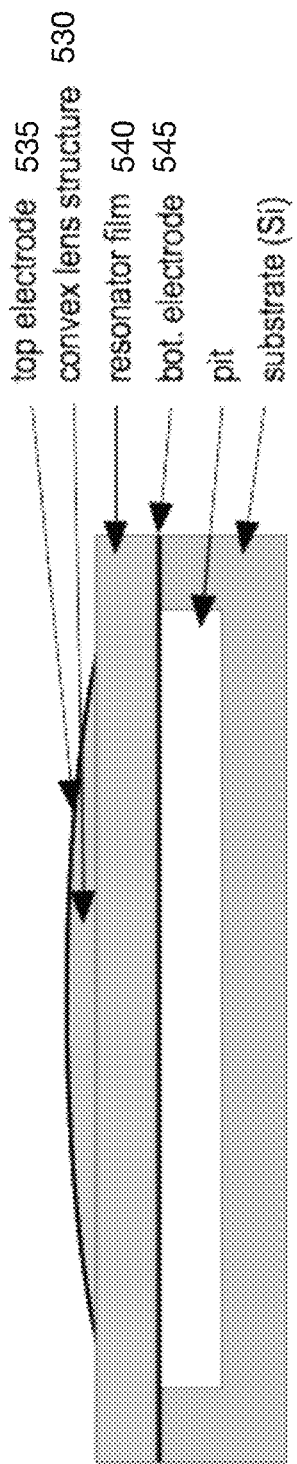
FIG. 5B illustrates another lens embodiment of the focused resonator.

In another embodiment, the convex structure 530 may be formed by thickening the central portion of the resonator 540, as shown in FIG. 5B. In one embodiment, the convex structure 535 may be formed by additional deposition of material in the central portion of the resonator. In one embodiment, such deposits may be tapered, forming a convex area. In one embodiment, thickening the resonator 540 like a lens causes the resonator 540 to behave like a lens, and focus the acoustic power away from the edges. In one embodiment, thickening could be accomplished by the sputter application of additional piezoelectric material through an aperture mask. Alternative methods of forming such a shape in the resonator may be utilized, including etching or deposition of additional material layers.

In one embodiment, the additional material thickness can be a few atomic layers or less such as a fractional atomic layer by using a sparse partial coverage of atoms in the resonator center.

Figure 5C:
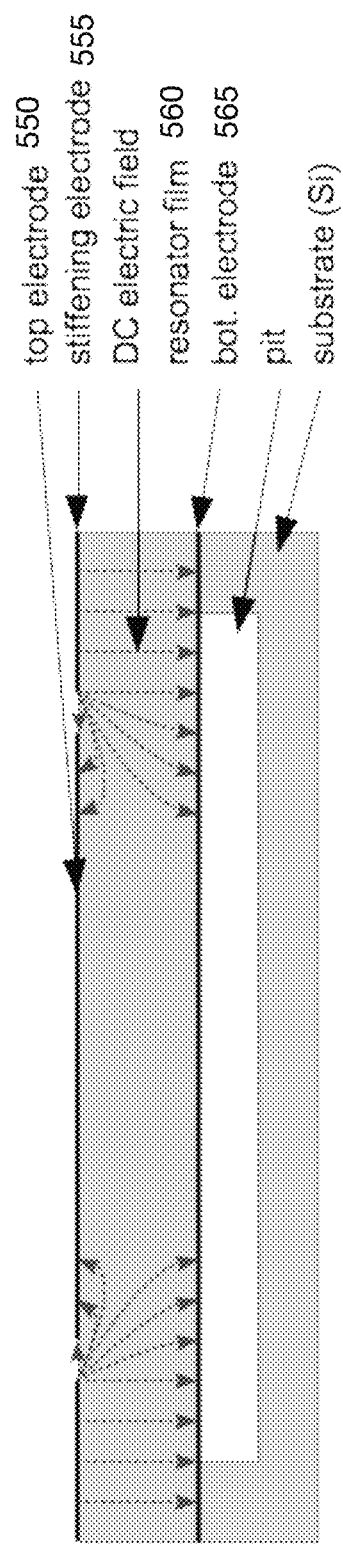
FIG. 5C illustrates another embodiment of the focused resonator.

In another embodiment, as an alternative to thickening the central portion of the device, the edges of the device may be thinned instead. In one embodiment, thinning could be accomplished by ion milling or some other etching technique (wet or dry) that allows for appropriate spatial selectivity so that only the portions of the device that require thinning are subject to etching. Either method, of adding material or subtracting material, would be equivalent since the end result is a convex (or concave) lens shape with respect to the acoustic thickness of the device. However, there may be advantages in adding or subtracting material that depend on device design and which one is used will depend on details of design and available manufacturing processes FIG. 5C illustrates another embodiment of the focused resonator in which a stiffening electrode structure is included in the device's "material stack." The stiffening electrode structure 555 provides a DC electrostatic bias field to the device's edges. The component of the applied DC field normal to the device's plane would preload the piezoelectric material of the resonator 560, causing it to stiffen and have a slightly higher sound speed (or in the case where a diverging lens is desired the resonator electrodes could have a DC bias impressed on them with the addition of an additional edge field imposed to reduce the overall field at the edges). This local stiffening would cause the regions under stress to have a shorter acoustic path and the regions not under stress, near the device's center, to have a longer one, even though the physical thickness of the film is constant. This embodiment has the advantage of being electrically adjustable for tunable device behavior. However, it does require a stable bias voltage to adjust the focus.

The focused resonator's principle of operation is to create an acoustic path that is slightly longer in the resonator's central region than at its edges. This causes the wave front in the resonator to have its curvature corrected to reduce spreading energy into the substrate at the resonator's edges by diffraction. In general, for a given wavelength and resonator size, the acoustic path will be lengthened by the approximately same amount, regardless of whether the lengthening is done by changes in material thickness, stiffness, or other means.

In one embodiment, the added thickness is based on considerations of wave front diffraction. The criterion for suppressing diffractive losses into the substrate is that there be a correction to the curvature of the wave front propagating within the resonator that is opposite to the curvature induced by diffraction. In this way, the wave front remains normal to the surface of the resonator and does not propagate energy to the resonator's edges.

Figure 5D:
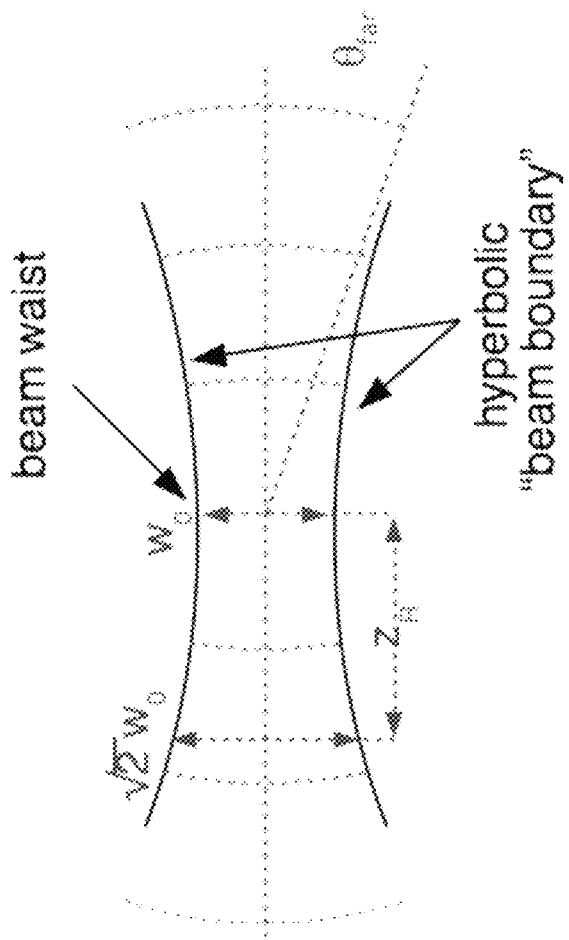
FIG. 5D illustrates one embodiment of the geometry of the acoustic beam waist.

If the wave within the resonator is treated as a traveling wave instead of as a wave reflected between the resonator boundaries then a procedure similar to the standard one for finding the divergence of a Gaussian beam waist may be employed. The curvature of the wave fronts is zero at the beam waist and also approaches zero as $z \to \pm\infty$. It is equal to $1/R$ where $R(z)$ is the radius of curvature as a function of position along the beam, given by $$R(z) = z\left[1 + \left(\frac{z_R}{z}\right)^2\right]$$

where the beam waist is $w_0$, and $z_R$ is the Rayleigh range. FIG. 5D shows the geometry of the beam waist.

Thus, after substitutions of setting the beam waist to the resonator diameter, $w_0 = d$, the Rayleigh range, $z_R = \pi w_0^2/\lambda$, and setting $z = \lambda/2$ (for a half wavelength thick resonator), the geometry of $R(z)$ is:

$$R(z) = \frac{\lambda}{2}\left[1 + \left(\frac{2\pi d^2}{\lambda^2}\right)^2\right]$$

The equation for solving for the curvature at a distance of the thickness of the resonator, or half a wavelength, from the beam waist is used to calculate the added thickness. That is to say, the beam waist is positioned on the bottom surface of the resonator and the calculations determine the curvature of the wavefront at the top surface. The calculations are concerned with the wavefront very close to the beam waist (very closely in the diffractive near field). Once the curvature is calculated, and given the size of the resonator, the distance needed to add to the acoustic path length in the center of the resonator can be determined.

Given the curvature of the wavefront at a given distance from the beam waist we can use simple geometry to find the added thickness, $\Delta z$.

$$\Delta z = R - R_{cos}\theta \approx R - R(1 - \tfrac{1}{2}\theta^2 + \ldots)$$

Using the small angle approximation of $\theta = (d/2)/R$ $$\Delta z \simeq \frac{d^2}{8R}$$

To simplify $R(z)$, we note that the 1 inside the brackets contributes little in the case where $z_R \gg z$, so by eliminating that:

$$R(z) = \frac{\lambda}{2}\left(\frac{2\pi d^2}{\lambda^2}\right)^2$$

For $z = \lambda/2$, $$\Delta z \simeq \frac{\lambda^3}{16\pi^2 d^2}$$

Using this equation to calculate some examples shows that the added thickness is easily added. For $f=2.5$ GHz, $\lambda=4$ μm (assuming AlN), and $d=100\lambda/2=200$ μm, $\Delta z \approx 1.0 \times 10^{-11}$ m=0.01 nm=0.1 Angstroms. $f=600$ MHz, $\lambda=16.7$ μm (assuming AlN), and $d=400$ μm, $\Delta z \approx 1.8 \times 10^{-10}$ m=0.18 nm=1.8 Angstroms.

Thus, the added thickness of a few atoms in the center of an FBAR may improve its Q by a significant amount. The added thickness does not have to be a continuous sheet of AlN (or electrode material or other material in the device stack) molecules. In one embodiment, it can be a sparse density of molecules that is only a partial monolayer and still contribute to a change in acoustic thickness that is on-average a fraction of a molecular layer thickness. In one embodiment, the added material could be composed of additional incorporated layer with acoustic properties, that is neither of the resonator nor of the electrode structure. In one embodiment, such added material may have an acoustic mismatch such that the layer could be physically thicker than what is indicated by the above formulae but that nevertheless introduces a similar phase delay to that which would be introduced by the very small thickness change described by the formulas above. In one embodiment, the relationship of the thickness of the material that may be incorporated may depend on the acoustic properties of the material.

Figure 5E:
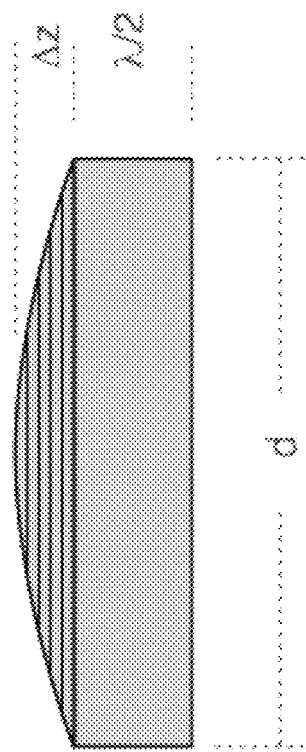
FIG. 5E illustrates one embodiment of the geometry of the resonator.
Figure 5F:
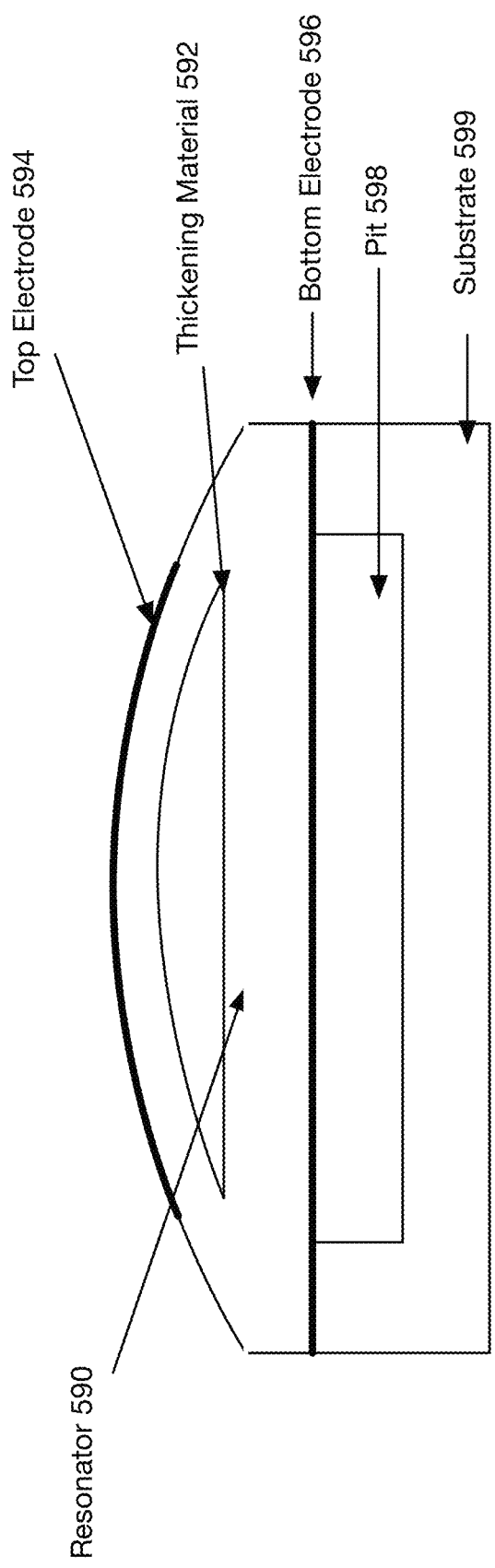
FIG. 5F illustrates one embodiment of using an added material having an incorporated layer with mismatched acoustic properties to achieve the thickening.

FIG. 5E illustrates one embodiment of the geometry of the central area of the resonator, showing the dimensions of the relative thickening of the resonator material. The relative thickening may be achieved by adding extra material at the center area, or by thinning the edge area. The material added to thicken the central portion of the resonator in one embodiment would be of the same form as that shown in the existing FIGS. 5A and/or 5B, except that the added thickness would be greater (physically thicker) but the acoustic wave extending into the added material would be of much reduced amplitude because the mismatched material would acoustically couple only minimally to the resonator structure itself.

In one embodiment, the resonator could be thinned toward its edges to produce the convex shape. The thinning could be accomplished either mechanically by etching or milling, in one embodiment. In one embodiment, the thinning may be achieved by passively stressing the piezoelectric material using ion implantation as described below or by actively stressing the piezoelectric material by use of a non-uniform electrostatic field, as discussed above.

Any method that causes a variation of acoustic thickness across the resonator will result in some spreading of the device's resonant frequency—because the device's resonant frequency is determined by its acoustic thickness. However, care must be taken in the optimization of the design. There is an implicit tradeoff between Q improvement due to the amount of energy loss reduction from focusing and the reduction in Q from spreading the resonator's operating frequency over a broader bandwidth. However, a 2.5 GHz resonator with very low mass electrodes will have a film thickness of about d=v/2f=2 μm. If the variation in thickness is a few atomic layers, say half a nanometer, then the bandwidth broadening only a few tenths of a part per thousand. That seems to provide a Q limit of:

$$Q \lesssim \frac{2\pi}{0.5 * 10^{-3}} \approx 10^4$$

due to bandwidth broadening from thickness variation. Since current best devices have a Q well under 10,000 this broadening is relatively minor compared to the benefit derived from the shaping of the resonator.

The resonator will automatically seek out the resonant frequency with the least losses. Hence, the low frequency portion of the resonance would be preferred by the resonator itself because that would have the wave propagating farthest from the device's edges. If an impulse response is provided to the resonator the frequencies with the lowest losses will persist the longest and have the most gain applied to them by the resonator's feedback amplifier electronics. Thus, portion of the resonance corresponding to the resonant frequency range of the device's center will dominate. However, in one embodiment, this effect may be reinforced by electronically pulling the resonator's drive frequency slightly towards the lower shoulder of its operating band. The FBAR can preferentially drive the portion of the resonance that is matched to the central, lower frequency, portion of the shaped resonator structure. This technique improves the device's performance by effectively modifying its response to be larger in the center than at the edges. This will result in a response biased towards the half cosine of FIG. 3E, and away from the top hat response of FIG. 3A. By adjusting the drive frequency, the system mitigates the loss of Q from resonator bandwidth spreading brought on by the variation in device thickness (convexity) and provides additional mitigation against energy losses at the resonator edges by reducing the stimulation of the resonator edges by way of resonant mismatch.

Focused Ground State Resonator

Another way to tailor the device piezoelectric material's response to an applied electric field is to implant ions in the device's piezoelectric material near the resonator's edges. This changes the physical properties of the material. In one embodiment, the implantation would be performed after the resonator piezoelectric material was constructed but prior to creation of the FBAR. In another embodiment, it may be possible to stiffen the electrode structure instead of the piezoelectric material of the FBAR since the acoustic wave within the device transits through the electrodes as well as the piezoelectric material. Local alterations of the acoustic path length are somewhat agnostic to where along the acoustic path the alteration happens. For example, ion implantation may be used for stiffening of metals.

Obviously, stiffening of the electrode structure, instead of the piezoelectric material, would leave the piezoelectric response of the device unaltered from its ordinary, uniform response. There may be design advantages to stiffening without modifying the piezoelectric response. Alternatively, if more alteration to the piezoelectric material is desired than would be the case for acoustic focusing alone, it may be advantageous to "over-expose" the ion implantation in some areas of the piezoelectric material, and implant ions in the central portion of the electrode structure to compensate. For example, the ion implantation may be overexposed near the edges of the resonator piezoelectric material and then additional ions may be implanted in the central portion of the electrode structure. There may be design flexibility allowed by separate ion implantation patterns to both the piezoelectric material and the electrode structures.

In one embodiment, the process lays down a uniform film on a uniform substrate and then post process the film layer. In one embodiment, the concentration of implanted ions would be approximately zero in the central area of the resonator, and then have a number density such that it progressively alters the material's piezoelectric properties toward the device's edges, yielding a downward parabolic shaped piezoelectric response. This allows the use of a simple, planar electrode structure that is familiar to FBAR construction and appropriate to device mass fabrication on wafers. To be sure, it may be appropriate to vary the electric field intensity as a spatial function as well as to tailor the material response.

An ion implantation gradient that rises in density as a function of radius from the device's center also stiffens the piezoelectric material leading to an upward change in the local speed that sound travels through the material. Since the implantation would be greater near the device's edge the sound speed would be greater near the edge. Increasing the sound speed is the same as reducing the acoustic thickness of the device material. This effective thinning of the acoustic thickness is used to construct a self-focusing effect to further constrain the acoustic energy away from the device's edges.

Figure 6A:
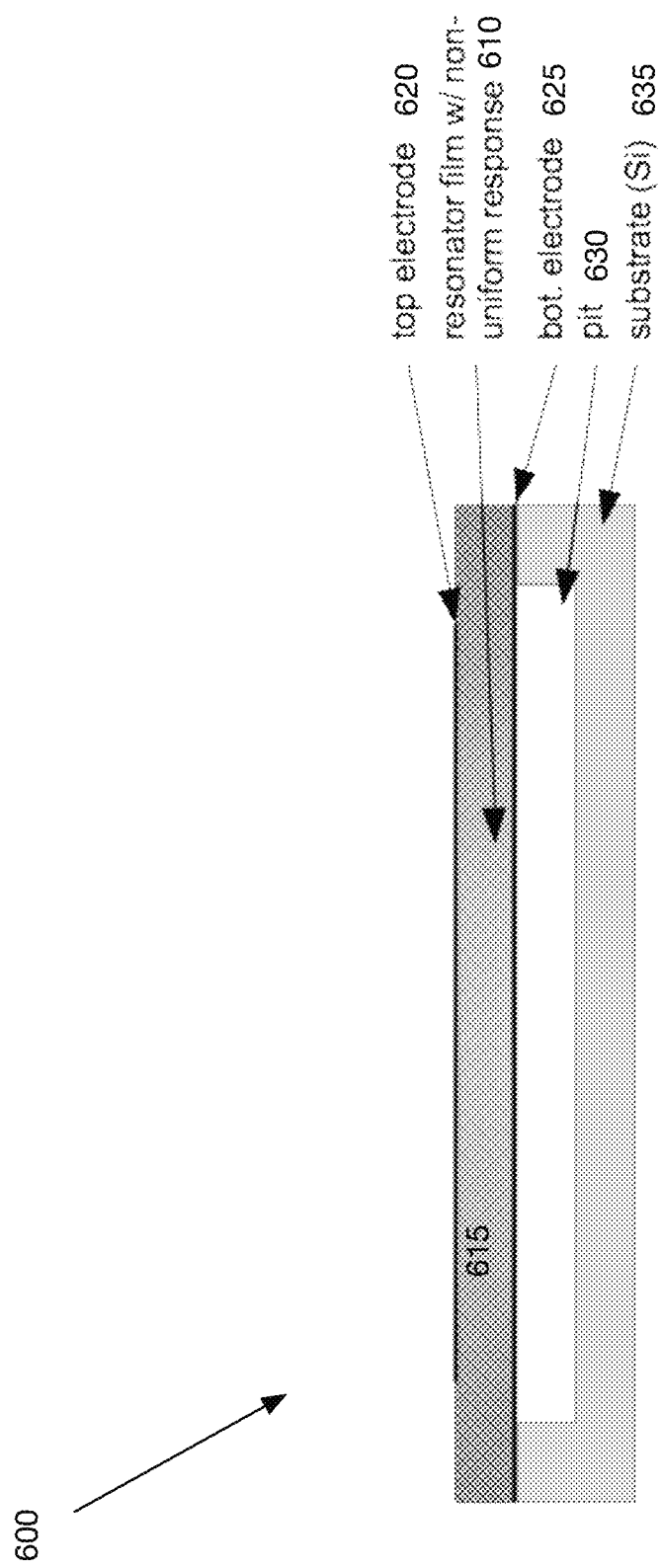
FIG. 6A illustrates one embodiment of a focused ground state resonator.

FIG. 6A illustrates one embodiment of a focused ground state resonator 600. The resonator film 610 has a bottom electrode 625 and a top electrode 620. The resonator 610 is positioned over a pit 630 in the substrate 635. The stippling 615 of the resonator film 610 shows one embodiment of the implantation gradient of the ions. In one embodiment, the penetration depth is on the order of 1-2 μm. For resonators operating below 1-2 GHz this may be accomplished by implantation in the top portion of the film. In one embodiment, the system is flexible as to a concentration of ions— roughly the same total number of ions as would be needed to stiffen the material all the way through, but with a density concentration near the upper surface of the film. In one embodiment, the ion density would be maximal at the stopping depth of the ions in the material, not at the top surface.

By selectively partially destroying the electromechanical response of the piezoelectric film of the resonator its response to a driving field approximates the half-cosine function even when the film itself is of constant physical thickness and even when the electric field from the electrode structure is uniform. The implanted ions disrupt the crystal structure of the film that is so necessary for piezoelectric behaviors, stiffen the structure of the material by putting the ion implanted portion of the film under compressive stress, and may add an implanted electric polarization to further enhance the compressive preloading by providing an electric field that acts locally on whatever local portions of the piezoelectric material that still retain the piezoelectric behavior associated with an undisrupted crystal structure.

Spatially structured degradation of the piezoelectric material's response to an electric field (and its ability to generate an electric field) will cause the device's response to be closer matched to the ground state, fundamental mode of resonance. The "fundamental mode" of resonance of the very simple theoretical a 2-dimensional cross-sectional slice through a three dimensional planar resonator structure (such as shown in cross sectional FIGS. 1A and 1B, where the dimension "sticking out of the page" has been suppressed) is the largest half-cosine function that fits between the edges of the resonator. It has the longest wavelength of any of the modes. For planar resonators, the "fundamental mode" would be the lowest order harmonic mode of the 2-dimensional structure (analogous to the half-cosine, but in more than a single dimension). The accompanying reduction in active acoustic modes tangent to the device's surface will reduce energy transport out of the resonator structure and improve its Q factor. The active acoustic modes refer to the energy content of available vibration modes.

Note that the simplified structures shown here show a time slice through a resonator structure, rather than the exact response of a resonator that is an actual planar structure. The depiction is of a 2D cross sectional slice through a 3D, planar structure. This suppresses the portion of the stress/deflection (response) pattern that "sticks out of the page", leaving only a 2D depiction of the response. However, since the thickness of the resonator is treated as if it were one slice in a repeating structure (the hallway analogy above), with the acoustic wave passing in one direction, rather than bouncing back and forth, it is effectively a "time" dimension, not a space dimension. The deflection pattern is not a cosine function in only 1D, but is a product of two functions, one "across the page" and one "in/out of the page".

The complete response of a planar resonator depends on the three-dimensional resonator shape. For example (when viewed from the top), a square resonator will have a cosinusoidal function along its width multiplied by a cosinusoidal function along its height. In cross section, one of the cosine functions is selected as representative. A circular resonator structure will have a Bessel mode structure as its resonant modes, not cosines. Thus, a slice through a square gives a realistic solution to the response along the cross-sectional portion shown but a slice through a circular resonator will not have cosinusoidal modes as its response. Instead the response will look somewhat like a cosine function, big in the center and zero at the edges, and it'd be analogous to the lowest order mode of a square, but it is not exactly the same thing. Thus, while the side-view cross section of a square resonator is indistinguishable from the side-view cross section through a circular resonator the modes in either would be different because of the shape of the material being suppressed in the diagram.

Spatially structured compressive preloading of the piezoelectric material using ion implantation increases its mechanical stiffness and increase the speed sound travels through the material. The increase in local sound speed acts to decrease the local acoustic distance in the material, causing its acoustic shape to be convex lens-like in the ion implanted regions of the resonator film.

In one embodiment, spatially structured implantation of ions with complimentary charges in the upper and lower volumes of the piezoelectric material can be used to place the nearby material in a locally generated electrostatic field.

Figure 6B:
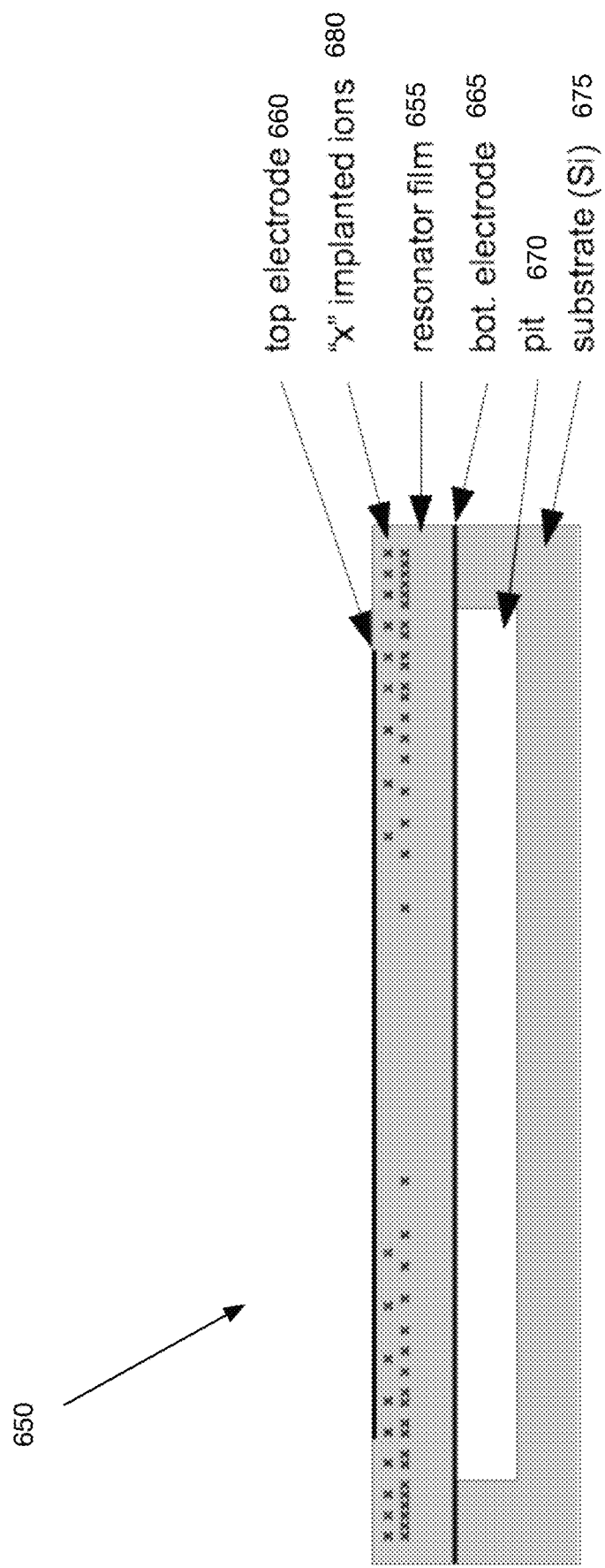
FIG. 6B illustrates one embodiment of the implantation pattern in the focused ground state resonator.
Figure 6C:
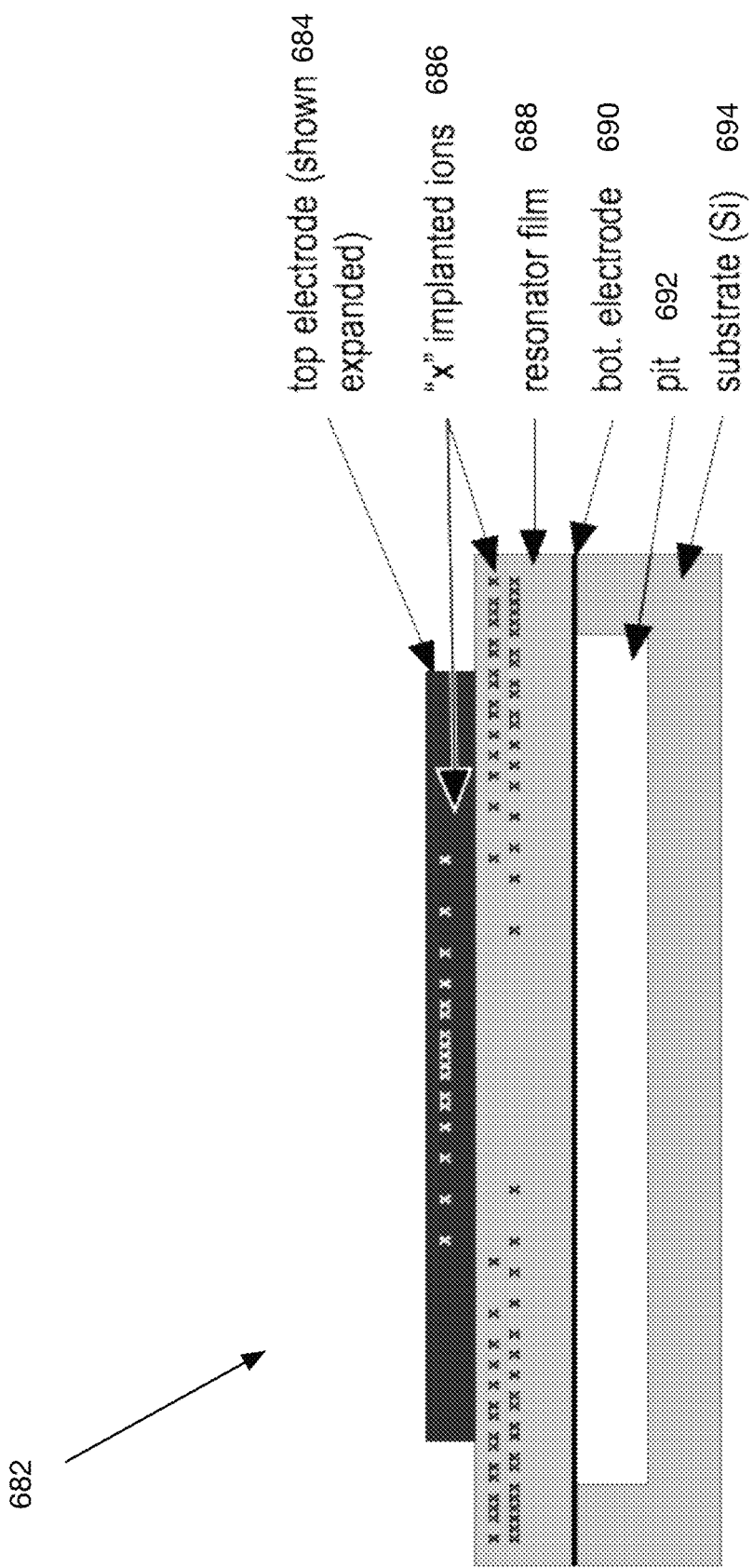
FIG. 6C illustrates one embodiment of an implantation pattern in which there is implantation in the resonator film and the electrode.

FIG. 6B illustrates one embodiment of the ion implantation pattern 680. If the piezoelectric material subject to this implanted electrostatic field has not had its electromechanical response completely destroyed by the implantation process then it will be caused to be under tensile or compressive stress—to extend or contract—due to the applied (implanted) electrostatic field. The placement of the implanted ions in the upper and/or lower portions of the material will affect whether the resulting electrostatic field is oriented along or against the axis of piezoelectric activity of the material. A proper arrangement of implanted ions can be used to place the material under compressive piezoelectric action, enhancing the compressive effects of the ion implantation and improving the behavior of the resulting acoustic lensing. For example, implanted positive ions that provide positive charges embedded in the AlN film's top portion will establish an electric field directed downward, through the AlN, to the ground plane underneath. If the orientation of the AlN film is such that the embedded electric field causes the film to piezo-electrically contract then the film will be very slightly stiffer, compared to regions not subject to the embedded electric field, due to preloading. Conversely, ions implanted so that the resulting embedded electric field causes the piezoelectric material to expand will also preload the film by putting it under tensile, rather than compressive, stress. There will be differences in the behaviors of tensile vs. compressive preloading that may lead to advantageous tailoring of film and device behavior. FIG. 6C illustrates an alternative implantation approach, in which ion implantation is applied to the resonator as well as the electrode. The electrode in this illustration is shown thicker to allow the illustration of an exemplary implantation pattern. Note that the portion of the resonator under the electrode has ion implantation as well. In one embodiment, this design utilizes separate ion implantation for the resonator and the electrode.

Cyclic Axicon Resonator

Figure 7A:
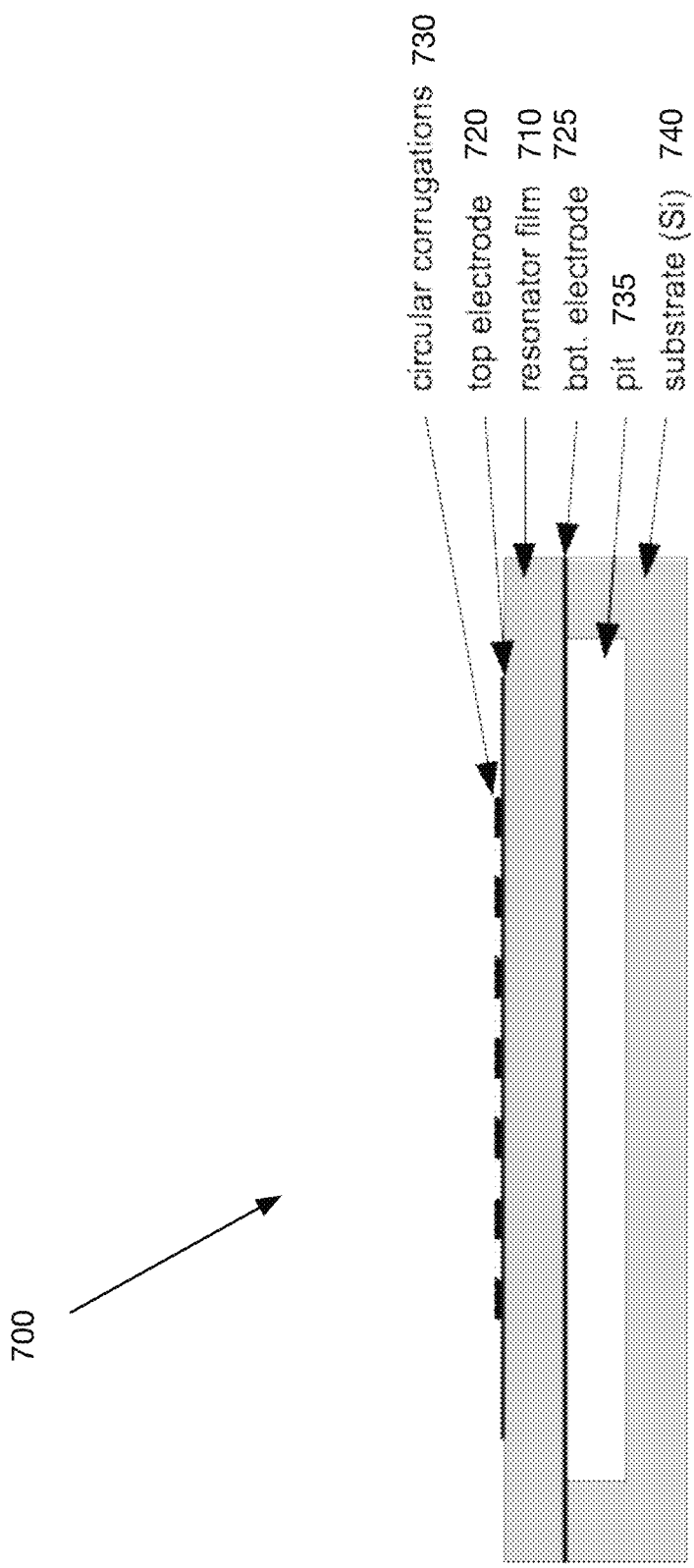
FIG. 7A illustrates one embodiment of a cyclic axicon resonator.

FIG. 7A illustrates one embodiment of a cyclic axicon resonator. One embodiment of the "Cyclic Axicon" resonator 700 design consists of an etched pattern of rings 730 on the device's top electrode 720. Etching the top electrode 720 gives the sharpest, most vertical sidewalls to the resulting "corrugation" structure, which has the sharpest contrast step in the resulting acoustic structure. In cases where a sharp step in thickness gives an advantageous diffractive pattern this may be desirable. Other ways of creating the pattern of rings may be used, such as material deposition, cutting, ion implantation to stiffen and modify the piezoelectric material or modify stiffness of the electrode structure, or other methods. These methods may give a more gradual change in acoustic depth of the axicon rings, leading to a different diffractive behavior with different advantages than those generated by an axicon mask with sharp steps of depth.

The depth of etching for the circular "corrugations" 730 is a few tens of nanometers for resonators with multi GHz operating frequency to perhaps over a micron for resonators 710 with sub-GHz operating frequency. The depth of etch relative to the resonator film thickness determines the contrast of the resulting diffractive acoustic element, thus has an effect on how strongly the acoustic wave in the resonator is converted into a Bessel beam-like configuration. The spacing of the circular corrugations is lithographically matched to the natural operating frequency of the resonator. Thus, in one embodiment, each resonator of a particular size and thickness may have structure optimized in ring spacing and ring depth to match.

FIG. 7B illustrates an exemplary cyclic axicon mask, used the impulse simulations illustrated in FIGS. 7C and 7D. As can be seen, after the steady state pattern shown in FIG. 7D develops it is essentially unchanging, indicating very low coupling to the outside environment.

In one embodiment, the known circular FBAR problem of mechanical membrane rupture in the center may be addressed by this design. The mechanical rupture is caused by the tendency for a divergence in the power per unit area of the Bessel function at its center. For example, in the case of Bessel beams, each of the ring-like structures of the beam carry an equal amount of power and the power density of the central spot is therefore high. In one embodiment, this may be addressed by modifying the height of the central portion of the circular corrugations such that the power is deflected slightly away from the center of the structure. In one embodiment, the axicon mask (ring set) may be applied to non-circular resonator shapes, such as a resonator in the irregular pentagonal shape.

A variation of the Cyclic Axicon Resonator design could use the diffraction structure of a spherical wave front intersecting with a plane instead of uniformly spaced, concentric rings. Such a diffraction pattern is known as Newton's Rings or a continuous zone plate or a stepped zone plate. The diffraction pattern is similar to the cyclic axicon pattern shown in FIGS. 7A-7D, with a non-uniform spacing of the rings. The spacing of the rings is defined by the wavelength of the waves they are constructed from, and the focal distance they are intended to reproduce. A Newton's Rings variation of the diffractive design is used as a method of imparting an acoustic curvature to the resonator surface that is similar to that caused by a spherical surface. Other variations of diffractive structures comprised of acoustic speed variations may be used.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. A resonator comprising:
a piezoelectric material having an acoustic path that is longer in a central region of the resonator than at edges of the resonator by shaping the resonator, the shaping comprising adjusting an acoustic stiffness of the piezoelectric material, wherein the piezoelectric material is stiffened with an ion implantation gradient, with the ion implantation stiffening edges of the piezoelectric material more than a center of the piezoelectric material.

2. The resonator of claim 1, further comprising:
corrugations on a surface bounded by a top electrode to shape a response of the resonator.

3. The resonator of claim 2, wherein the corrugations have a non-uniform spacing defined by a continuous zone plate.

4. The resonator of claim 2, wherein the corrugations comprise one or more of: changes in a thickness of a material and changes in a mechanical stiffness of the material.

5. The resonator of claim 1, further comprising:
a substrate;
a pit in the substrate, the pit having an edge; and
the piezoelectric material positioned over the pit and touching the substrate on the edge, the resonator including a top electrode and a bottom electrode.

6. The resonator of claim 5, wherein the top electrode is on a top surface of the resonator, and the bottom electrode is on a bottom surface of the substrate, below the pit.

7. The resonator of claim 1, where the resonator is shaped using one or more of: depositing, etching, milling, and actively stressing the resonator.

8. The resonator of claim 1, further comprising a second set of implanted ions, with a higher density of the second set of implanted ions at a center of a resonator stack.

9. The resonator of claim 1, wherein the piezoelectric material comprises a piezoelectric film comprised of one of: aluminum nitride (AlN), zinc oxide (ZnO), and lead zirconate titranate (PZT).

10. The resonator of claim 1, wherein the adjusting of the stiffness utilizes stiffening electrodes on edges of the resonator.

11. The resonator of claim 1, further comprising:
a substrate;
an acoustic Bragg reflector stack; and
the piezoelectric material positioned over the acoustic Bragg reflector stack.

12. A resonator comprising:
a piezoelectric material;
the piezoelectric material configured to create an acoustic wave that is more intense in a central region of the resonator and substantially attenuated at an edge of the resonator, by modifying a driving electric field to have an intensity approximately corresponding to a first order harmonic for a resonator shape so it is diminished at the edge of the resonator to produce a response in the resonator corresponding to a lowest order eigenmode for the resonator.

13. The resonator of claim 12, further comprising:
a substrate;
a pit in the substrate, the pit having an edge; and
the piezoelectric material positioned over the pit and touching the substrate on the edge, the resonator including a top electrode and a bottom electrode.

14. The resonator of claim 13, wherein the top electrode is on a top surface of the piezoelectric material, and the bottom electrode is at a bottom of the pit.

15. The resonator of claim 13, further comprising:

a device layer having a top and a bottom, the top of the device layer designed to support the piezoelectric material; and the bottom electrode positioned on the bottom of the device layer, wherein the bottom electrode is not in physical contact with the piezoelectric material.

16. The resonator of claim 12, wherein a response of the piezoelectric material is modified to have a non-uniform response to an applied electric field.

17. The resonator of claim 16, wherein the non-uniform response is due to implanted ions in the resonator, with a density of the implanted ions altered across an area of the resonator.

18. The resonator of claim 12, wherein an electric field applied to the resonator is spatially modified.

19. The resonator of claim 12, wherein a bottom electrode spans only a portion of the resonator to create a tapered electric field towards the edge of the resonator.

20. A piezoelectric resonator comprising:

a substrate;

a pit in the substrate, the pit having an edge;

a piezoelectric film suspended over the pit between a top electrode and a bottom electrode, touching the substrate at the edge;

wherein the bottom electrode is on the substrate and not in physical contact or acoustic contact with the piezoelectric film; and the piezoelectric resonator configured to create an acoustic wave that is more intense in a central region of the resonator and substantially attenuated at an edge of the resonator, by modifying a driving electric field to have an intensity approximately corresponding to a first order harmonic for a resonator shape so it is diminished at the edge of the resonator to produce a response in the resonator corresponding to a lowest order eigenmode for the resonator.

21. The resonator of claim 20, wherein the acoustic wave in the resonator is shaped by tailoring one or more of the piezoelectric film response to the driving electric field, the top electrode, and the bottom electrode.

* * * * *